United States Patent
Wen et al.

(10) Patent No.: US 9,466,235 B2
(45) Date of Patent: Oct. 11, 2016

(54) TFT ARRAY SUBSTRATE, DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Lin Wen, Shanghai (CN); Hong Li, Shanghai (CN); Shuai You, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 150 days.

(21) Appl. No.: 14/609,386

(22) Filed: Jan. 29, 2015

(65) Prior Publication Data
US 2015/0379912 A1  Dec. 31, 2015

(30) Foreign Application Priority Data
Jun. 30, 2014 (CN) .......................... 2014 1 0309405

(51) Int. Cl.
| | | |
|---|---|---|
| *G09G 3/20* | (2006.01) | |
| *G11C 19/28* | (2006.01) | |
| *G09G 3/00* | (2006.01) | |
| G09G 3/32 | (2016.01) | |
| G09G 3/36 | (2006.01) | |

(52) U.S. Cl.
CPC ................ *G09G 3/20* (2013.01); *G09G 3/003* (2013.01); *G11C 19/28* (2013.01); *G09G 3/3266* (2013.01); *G09G 3/3677* (2013.01); *G09G 2310/0283* (2013.01); *G09G 2310/0286* (2013.01); *G09G 2320/0219* (2013.01); *G09G 2380/14* (2013.01)

(58) Field of Classification Search
CPC ............ G09G 2310/0286; G09G 2310/0283; G09G 2310/0264; G09G 2310/0267; G09G 2310/02; G09G 2310/0202; G09G 2310/021; G09G 2310/0213; G09G 3/3674; G09G 3/3677; G09G 3/3266; G09G 3/3611; G09G 3/3625; G09G 3/3648; G09G 3/367; G09G 3/368; H04N 13/0452; H04N 13/0456; H04N 13/0454; H04N 13/0497; H04N 21/242; H04N 13/0409
See application file for complete search history.

(56) References Cited

U.S. PATENT DOCUMENTS

2012/0162206 A1   6/2012  Nam et al.
2012/0256977 A1*  10/2012  Jeong ................. H04N 13/0454
                                               345/691

(Continued)

FOREIGN PATENT DOCUMENTS

| CN | 102547320 A | 7/2012 |
| CN | 102651203 A | 8/2012 |

*Primary Examiner* — Grant Sitta
*Assistant Examiner* — Amen Bogale
(74) *Attorney, Agent, or Firm* — Alston & Bird LLP

(57) ABSTRACT

A TFT array substrate is disclosed. The array substrate includes gate lines, first and second gate driving circuits, first, second, third, and fourth clock signal lines, first and second initial signal lines, first and second initial transistors, and first, second, third, and fourth clock transistors. The first gate driving circuit includes m stages of first repeating units. The second gate driving circuit includes n stages of second repeating units. Where m and n are positive integers, and 2≤m, 2≤n.

19 Claims, 11 Drawing Sheets

(56) References Cited

U.S. PATENT DOCUMENTS

2012/0293762 A1* 11/2012 Shin ............... G09G 3/3677
349/139

2014/0321599 A1* 10/2014 Cho ................. G11C 19/28
377/64
2016/0055818 A1* 2/2016 Kim ................ H04N 13/0497
345/210

* cited by examiner

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410309405.3 filed with the Chinese Patent Office on Jun. 30, 2014 and entitled "TFT ARRAY SUBSTRATE, DISPLAY PANEL AND DISPLAY DEVICE", the content of which is incorporated herein by reference in its entirety.

TECHNICAL FIELD

The present application relates to the field of display technologies, in particular to a Thin-Film Transistor (TFT) array substrate, a display panel and a display device.

BACKGROUND OF THE INVENTION

Display devices become more and more popular. In actual use, however, there is a problem that mutual conversion between 3D display mode and 2D display mode is inconvenient in the display device.

BRIEF SUMMARY OF THE INVENTION

One inventive aspect is a TFT array substrate. The array substrate includes a plurality of gate lines, a first gate driving circuit, a second gate driving circuit, a first clock signal line, a second clock signal line, a third clock signal line, a fourth clock signal line, a first initial signal line, a second initial signal line, a first initial transistor, a second initial transistor, a first clock transistor, a second clock transistor, a third clock transistor, and a fourth clock transistor. The first gate driving circuit includes m stages of first repeating units, where each stage of first repeating unit includes a first shift register, where the first shift register includes a first input terminal, a first clock signal terminal, a third clock signal terminal, and a first output terminal connected to the corresponding gate line. The second gate driving circuit includes n stages of second repeating units, where each stage of second repeating unit includes a second shift register, where the second shift register includes a second input terminal, a second clock signal terminal, a fourth clock signal terminal, and a second output terminal connected to the corresponding gate line. A drain electrode of the first initial transistor is electrically connected to a first initial signal line, a source electrode of the first initial transistor is electrically connected to the first input terminal of the first shift register from the first stage of first repeating unit, and a gate electrode of the first initial transistor is electrically connected to a first control line. A drain electrode of the second initial transistor is electrically connected to the source electrode of the first initial transistor, the second input terminal of the second shift register from the first stage of second repeating unit is electrically connected to the second initial signal line via a source electrode of the second initial transistor, and a gate electrode of the second initial transistor is electrically connected to a second control line. In each stage of first repeating unit, a drain electrode of the first clock transistor is electrically connected to the first clock signal line, a gate electrode of the first clock transistor is electrically connected to the first control line, and a source electrode of the first clock transistor is electrically connected to the first clock signal terminal. A drain electrode of the third clock transistor is electrically connected to the third clock signal line, a gate electrode of the third clock transistor is electrically connected to the first control line, and a source electrode of the third clock transistor is electrically connected to the third clock signal terminal. In each stage of second repeating unit a drain electrode of the second clock transistor is electrically connected to the source electrode of the first clock transistor, a gate electrode of the second clock transistor is electrically connected to the second control line, and the second clock signal terminal is electrically connected to the second clock signal line via a source electrode of the second clock transistor. A drain electrode of the fourth clock transistor is electrically connected to the source electrode of the third clock transistor, a gate electrode of the fourth clock transistor is electrically connected to the second control line, and the fourth clock signal terminal is electrically connected to the fourth clock signal line via a source electrode of the fourth clock transistor. In addition, m and n are positive integers, and 2≤m, 2≤n.

BRIEF DESCRIPTION OF THE DRAWINGS

The accompanying drawings described herein, which form a part of the present disclosure, are intended to provide further understanding to the present disclosure rather than limiting the present disclosure, where in the accompanying drawings.

DETAILED DESCRIPTION OF THE PREFERRED EMBODIMENTS

Figure 1A:
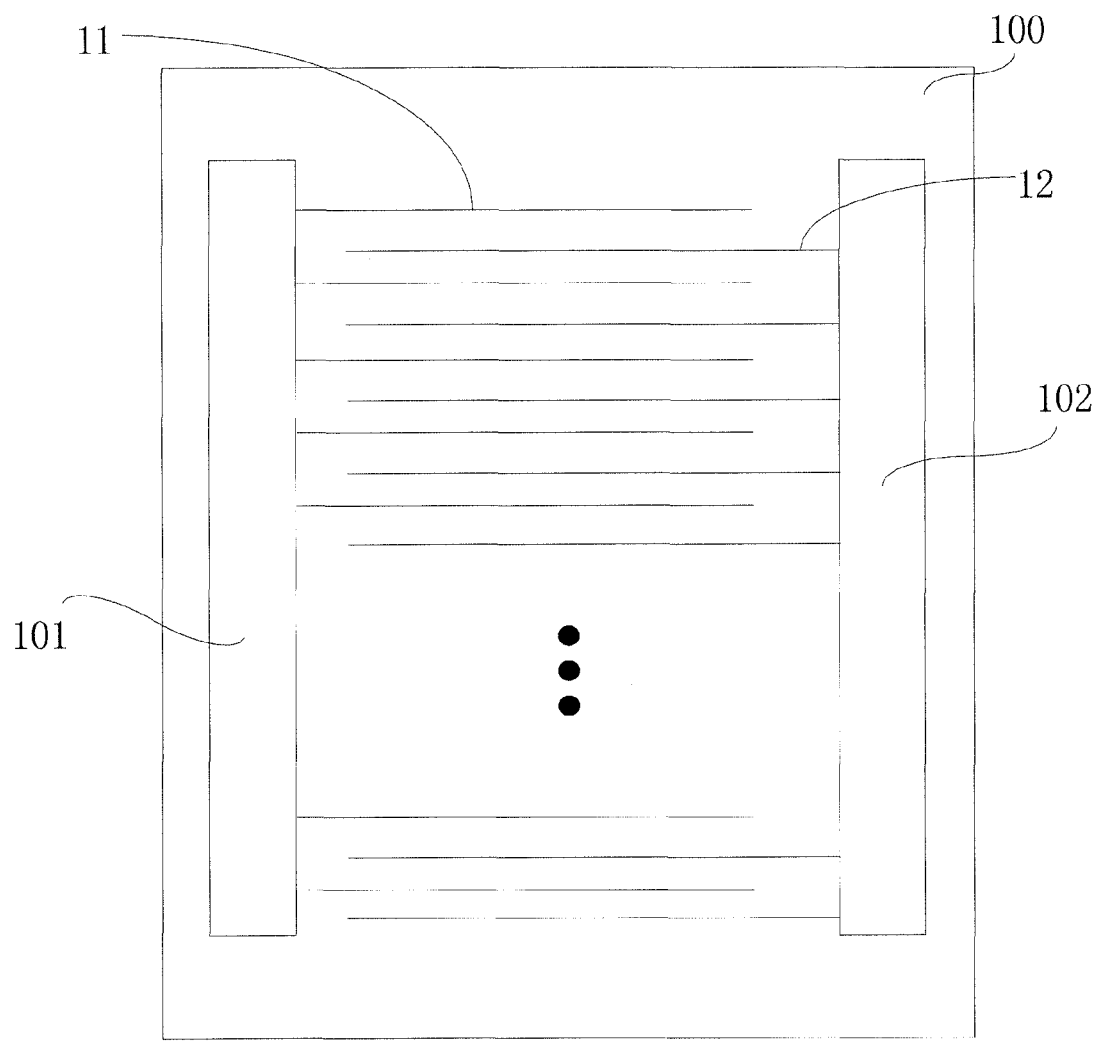
FIG. 1A is a simple schematic diagram showing a TFT array substrate according to an embodiment of the present invention.

The present disclosure will be completely described below in more detail in conjunction with the accompanying drawings and specific embodiments. It can be understood that, the specific embodiments described here are only intended to explain the present invention, but not to limit present invention. Besides, for ease of description, the drawings only show parts relevant to the present invention rather than all contents of the disclosure.

It is found by researchers that a conventional 3D display device includes a 3D display panel, where a lens film is adhered to a surface of the 3D display panel, and each pixel includes two sub-pixels which are configured for transmitting an image data signal for the left eye and an image data signal for the right eye, respectively; thus, in 3D display mode the image data signals are processed by an image processing system such that the image data signals transmitted by the two sub-pixels are different, and in 2D display mode, the image data signals are processed by the image processing system such that the image data signals transmitted by the two sub-pixels are identical. Therefore, a specialized image processing system is needed to process the image data signals, causing inconvenience for mutual conversion between the 3D display mode and the 2D display mode.

Technical solutions of the present disclosure are illustrated below by specific examples of embodiments, and it is noted that:

1. For scanning of each frame in a gate driving circuit, each stage of shift registers (which includes all of the first to eighth shift registers) needs to be reset once before scanning and cleared once after scanning. The reset before scanning means that an output terminal of each shift register is brought down to a low electrical potential before the shift register is scanned, in order to clear the shift register, i.e. the reset before scanning ensures that the output terminal of the shift register is always maintained at a low electrical potential before the shift register is scanned, thus ensuring good quality of the displayed image. The clearance after scanning means that the output terminal of the shift register is brought down to a low electrical potential after the shift register is scanned (i.e., after a gate driving signal is outputted from the shift register), thus ensuring that the output terminal of the shift register is maintained at a low electrical potential after the shift register is scanned, to avoid interference with the displayed image and prepare for the next scan.

2. Both a first gate driving circuit and a second gate driving circuit are applicable to a forward scan and a backward scan. For ease of the description, both the first gate driving circuit and the second gate driving circuit are for instance described as being used for the forward scan in embodiments, but the embodiments of the present invention are not limited thereto. In the present embodiment, first to ninth transistors T1 to T9 are N-channel Metal Oxide Semiconductor (NMOS) transistors, but in other embodiment, the first to ninth transistors T1 to T9 may alternatively be P-channel Metal Oxide Semiconductor (PMOS) transistors, which is not specifically limited by the embodiments of the present invention.

3. In the embodiments of the present invention, the TFT array substrate is not limited to be used in a Liquid Crystal Display (LCD), an Organic Light Emitting Display (OLED) or an electronic paper. In the embodiments of the present invention, the TFT array substrate is not limited to an amorphous silicon TFT array substrate, a Low Temperature Poly Silicon (LTPS) TFT array substrate or an oxide TFT array substrate.

4. In the embodiments of the present disclosure, first to eighth initial transistors, first to sixteenth clock transistors, and first to second pre-scan reset transistors are not limited to N-channel Metal Oxide Semiconductor (NMOS) transistors or P-channel Metal Oxide Semiconductor (PMOS) transistors. For ease of the description, the first to eighth initial transistors, the first to sixteenth clock transistors, and the first to second pre-scan reset transistors are described as N-channel Metal Oxide Semiconductor (NMOS) for example in the following various embodiments and accompanying drawings.

5. In the embodiments of the present invention, internal circuit structures and driving processes of the first to eighth shift registers, voltage ranges of first to sixteenth clock signals, voltage ranges of first to eighth second initial signals, waveforms of first to sixteenth clock signals, and voltage ranges and waveforms of first to second pre-scan reset signals are known in the art, and will not be discussed repeatedly in the present embodiment.

6. The embodiments of the present invention do not limit the voltage ranges of first and second control lines, as long as that: in 2D display mode, the first control line controls the first initial transistor, the third initial transistor, the fifth initial transistor, the seventh initial transistor, the first clock transistor, the third clock transistor, the fifth clock transistor, the seventh clock transistor, the ninth clock transistor, the eleventh clock transistor, the thirteenth clock transistor, the fifteenth clock transistor and the first transistor to be turned off, and the second control line controls the second initial transistor, the fourth initial transistor, the sixth initial transistor, the eighth initial transistor, the second clock transistor, the fourth clock transistor, the sixth clock transistor, the eighth clock transistor, the tenth clock transistor, the twelfth clock transistor, the fourteenth clock transistor, the sixteenth clock transistor and the second transistor to be turned on; in 3D display mode, the first control line controls the first initial transistor, the third initial transistor, the fifth initial transistor, the seventh initial transistor, the first clock transistor, the third clock transistor, the fifth clock transistor, the seventh clock transistor, the ninth clock transistor, the eleventh clock transistor, the thirteenth clock transistor, the fifteenth clock transistor and the first transistor to be turned on, and the second control line controls the second initial transistor, the fourth initial transistor, the sixth initial transistor, the eighth initial transistor, the second clock transistor, the fourth clock transistor, the sixth clock transistor, the eighth clock transistor, the tenth clock transistor, the twelfth clock transistor, the fourteenth clock transistor, the sixteenth clock transistor and the second transistor to be turned off.

Technical solutions of the present invention are illustrated below with specific embodiments.

As shown in FIG. 1A, the first embodiment provides a TFT array substrate 100, which includes: a plurality of gate lines including first gate lines 11 and second gate lines 12, a first gate driving circuit 101 electrically connected to the first gate lines 11, a second gate driving circuit 102 electrically connected to the second gate lines 12, a first clock signal line C1, a second clock signal line C2, a third clock signal line C3, a fourth clock signal line C4, a first initial signal line S1 and a second initial signal line S2. It is noted that locations of the first gate driving circuit 101 and the second gate driving circuit 102 relative to one another shown in FIG. 1A (i.e., the first gate driving circuit 101 is located on the left of the second gate driving circuit 102) is illustrative, the present disclosure is not limited thereto, and in other embodiments, as shown in FIG. 1B, the first gate driving circuit 101 is located on the right of the second gate driving circuit 102, but the present disclosure is not limited thereto, as long as that: the first gate driving circuit 101 and the second gate driving circuit 102 are located at both sides of the TFT array substrate 100, respectively, with the first gate driving circuit 101 being electrically connected to the first gate lines 11, and the second gate driving circuit 102 being electrically connected to the second gate lines 12.

Figure 1B:
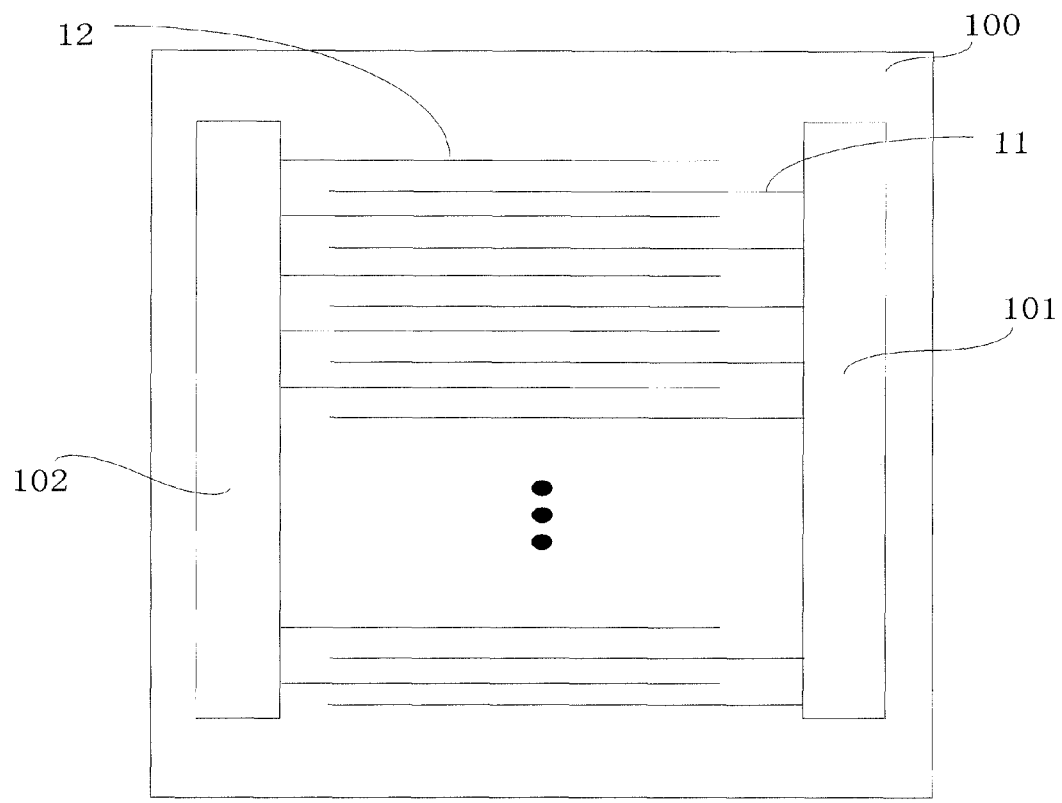
FIG. 1B is a schematic diagram showing the structure of another TFT array substrate according to an embodiment of the present invention.
Figure 2:
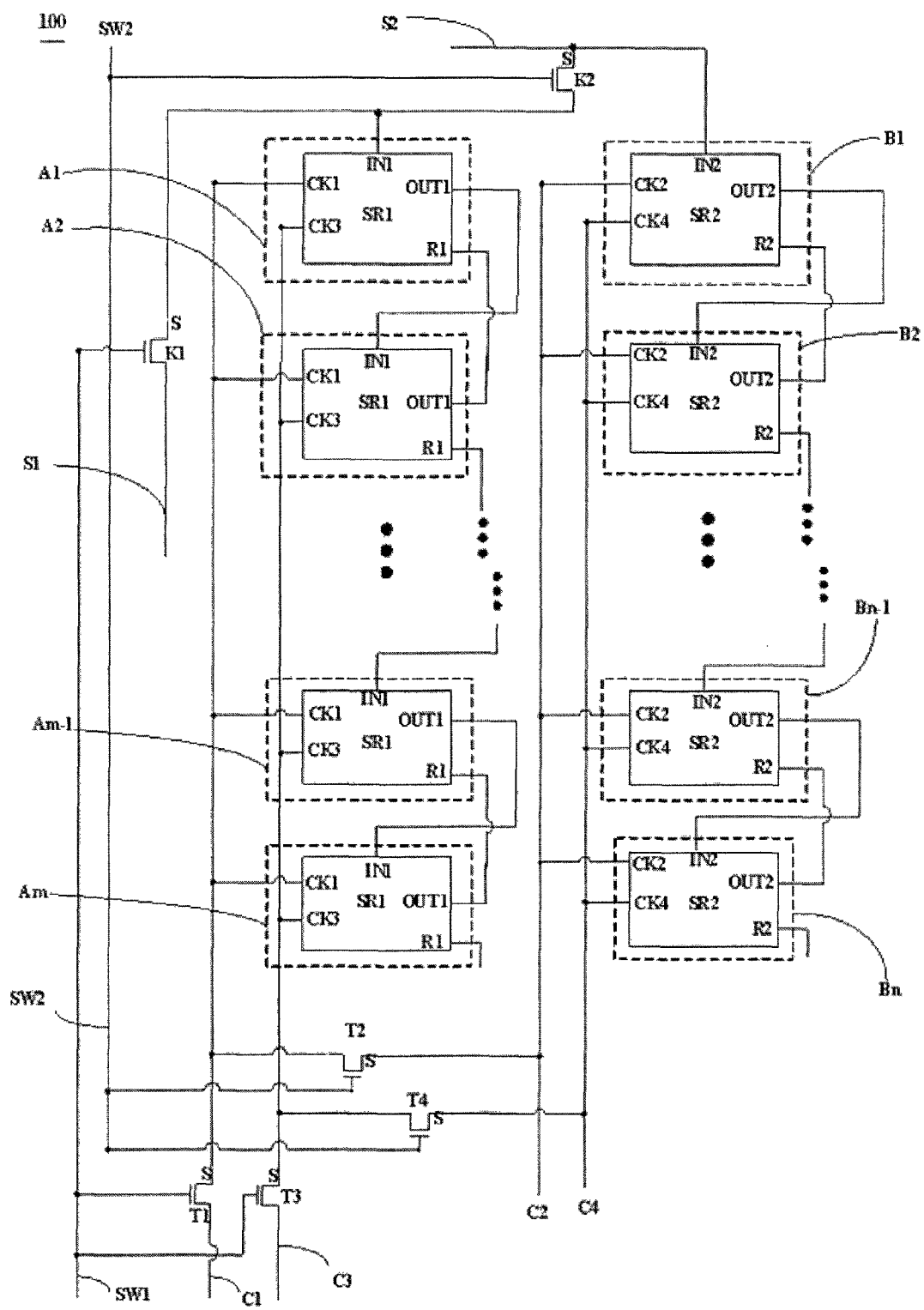
FIG. 2 is a schematic diagram showing the structure of a TFT array substrate according to an embodiment of the present invention.

As shown in FIGS. 1A, 1B and 2, the first gate driving circuit 101 includes: m stages of first repeating units A (which are represented by A1, A2, ..., Am, respectively), each stage of first repeating unit includes a first shift register SR1, and the first shift register SR1 includes a first input terminal IN1, a first clock signal terminal CK1, a third clock signal terminal CK3 and a first output terminal OUT1 connected to the corresponding gate line.

The second gate driving circuit 102 includes: n stages of second repeating units B (which are represented by B1, B2, ..., Bn, respectively), each stage of second repeating unit includes a second shift register SR2, and the second shift register SR2 includes a second input terminal IN2, a second clock signal terminal CK2, a fourth clock signal terminal CK4 and a second output terminal OUT2 connected to the corresponding gate line.

The TFT array substrate 100 further includes: a first initial transistor K1, a second initial transistor K2, a first clock transistor T1, a second clock transistor T2, a third clock transistor T3 and a fourth clock transistor T4, where, in the first stage of first repeating unit A1, a drain electrode of the first initial transistor K1 is electrically connected to a first initial signal line S1, a source electrode s of the first initial transistor K1 is electrically connected to the first input terminal IN1, and the gate electrode of the first initial transistor K1 is electrically connected to a first control line SW1;

in the second to m-th stages of first repeating units A2 to Am, the first input terminal IN1 of the first shift register SR1 from the i-th stage of first repeating unit Ai is electrically connected to the first output terminal OUT1 of the first shift register SR1 from the (i−1)-th stage of first repeating unit A(i−1); for example, in the second stage of first repeating unit A2, the first input terminal IN1 of the first shift register SR1 from the second stage of first repeating unit A2 is electrically connected to the first output terminal OUT1 of the first shift register SR1 from the first stage of first repeating unit A1;

in the first stage of second repeating unit B1, a drain electrode of the second initial transistor K2 is electrically connected to the source electrode s of the first initial transistor K1, the second input terminal IN2 of the second shift register SR2 from the first stage of second repeating unit B1 is electrically connected to a second initial signal line S2 via a source electrode s of the second initial transistor K2, and a gate electrode of the second initial transistor K2 is electrically connected to a second control line SW2;

in the second to n-th stages of second repeating units B2 to Bn, the second input terminal IN2 of the second shift register SR2 from the j-th stage of second repeating unit Bj is electrically connected to the second output terminal OUT2 of the second shift register SR2 from the (j−1)-th stage of second repeating unit B(j−1); for example, in the second stage of second repeating unit B2, the second input terminal IN2 of the second shift register SR2 from the second stage of second repeating unit B2 is electrically connected to the second output terminal OUT2 of the second shift register SR2 from the first stage of second repeating unit B1, where, $2 \leq i \leq m$, $2 \leq j \leq n$, and i, j, m, and n are positive integers;

for each stage of first repeating unit A1, A2, ..., Am, a drain electrode of the first clock transistor T1 is electrically connected to the first clock signal line C1, a gate electrode of the first clock transistor T1 is electrically connected to the first control line SW1, and a source electrode s of the first clock transistor T1 is electrically connected to the first clock signal terminal CK1;

a drain electrode of the third clock transistor T3 is electrically connected to the third clock signal line C3, a gate electrode of the third clock transistor T3 is electrically connected to the first control line SW1, and a source electrode s of the third clock transistor T3 is electrically connected to the third clock signal terminal CK3;

for each stage of first repeating unit A1, A2, ..., Am and each stage of second repeating unit B1, B2, ..., Bn, a drain electrode of the second clock transistor T2 is electrically connected to the source electrode s of the first clock transistor T1, a gate electrode of the second clock transistor T2 is electrically connected to the second control line SW2, and the second clock signal terminal CK2 is electrically connected to the second clock signal line C2 via a source electrode s of the second clock transistor T2;

a drain electrode of the fourth clock transistor T4 is electrically connected to the source electrode s of the third clock transistor T3, a gate electrode of the fourth clock transistor T4 is electrically connected to the second control line SW2, and the fourth clock signal terminal CK4 is electrically connected to the fourth clock signal line C4 via a source electrode s of the fourth clock transistor T4; where, in 2D display mode, the first control line SW1 controls the first initial transistor K1, the first clock transistor T1 and the third clock transistor T3 to be turned off, and the second control line SW2 controls the second initial transistor K2, the second clock transistor T2 and the fourth clock transistor T4 to be turned on;

in 3D display mode, the first control line SW1 controls the first initial transistor K1, the first clock transistor T1 and the third clock transistor T3 to be turned on, and the second control line SW2 controls the second initial transistor K2, the second clock transistor T2 and the fourth clock transistor T4 to be turned off.

Specifically, the first clock signal line C1, the second clock signal line C2, the third clock signal line C3 and the fourth clock signal line C4 are configured to output the first clock signal, the second clock signal, the third clock signal and the fourth clock signal, respectively, where, the first clock signal is inverse to the third clock signal, and the second clock signal is inverse to the fourth clock signal.

Further, each of the first shift registers SR1 further includes a first clear terminal R1, and each of the second shift registers SR2 further includes a second clear terminal R2, where, in the first to (m−1)-th stages of first repeating units A1 to A(m−1), the first clear terminal R1 of the first shift register SR1 from the k-th stage of first repeating unit Ak is electrically connected to the first output terminal OUT1 of the first shift register SR1 from the (k+1)-th stage of first repeating unit A(k+1); for example, the first clear terminal R1 of the first shift register SR1 from the first stage of the first repeating unit A1 is electrically connected to the first output terminal OUT1 of the first shift register SR1 from the second stage of the first repeating unit A2;

in the first to (n−1)-th stages of second repeating units B1 to B(n−1), the second clear terminal R2 of the second shift register SR2 from the p-th stage of second repeating unit Bp is electrically connected to the second output terminal OUT2 of the second shift register SR2 from the (p+1)-th stage of second repeating unit B(p+1); for example, the second clear terminal R2 of the second shift register SR2 from the first stage of the second repeating unit B1 is electrically connected to the second output terminal OUT2 of the second shift register SR2 from the second stage of the second repeating unit B2; where, k and p are positive integers, $1 \leq k \leq (m-1)$, $1 \leq p \leq (n-1)$.

With the TFT array substrate of the embodiment of the present invention, the first input terminal from the first stage of first repeating unit is electrically connected to the first initial signal line via both the source electrode and the drain electrode of the first initial transistor, the gate electrode of the first initial transistor is electrically connected to the first control line, the second input terminal from the first stage of second repeating unit is electrically connected to the second initial signal line via the source electrode of the second initial transistor, the drain electrode of the second initial transistor is electrically connected to the source electrode of the first initial transistor, and the gate electrode of the second initial transistor is electrically connected to the second control line; and for the each stage of first repeating unit and the each stage of second repeating unit, the first clock signal terminal is electrically connected to the first clock signal line via both the source electrode and the drain electrode of the first clock transistor, and the gate electrode of the first clock transistor is electrically connected to the first control line; the second clock signal terminal is electrically connected to the second clock signal line via both the source electrode and the drain electrode of the second clock transistor, and the gate electrode of the second clock transistor is electrically connected to the first control line; the third clock signal terminal is electrically connected to the third clock signal line via both the source electrode and the drain electrode of the third clock transistor, and the gate electrode of the third clock transistor is electrically connected to the first control line; the fourth clock signal terminal is electrically connected to the fourth clock signal line via both the source electrode and the drain electrode of the fourth clock transistor, and the gate electrode of the fourth clock transistor is electrically connected to the first control line; in 2D display mode, the first control line controls the first initial transistor, the first clock transistor and the third clock transistor to be turned off, and the second control line controls the second initial transistor, the second clock transistor and the fourth clock transistor to be turned on; in 3D display mode, the first control line controls the first initial transistor, the first clock transistor and the third clock transistor to be turned on, and the second control line controls the second initial transistor, the second clock transistor and the fourth clock transistor to be turned off, so that mutual conversion between the 2D display mode and the 3D display mode is convenient in the display device.

Figure 1C:
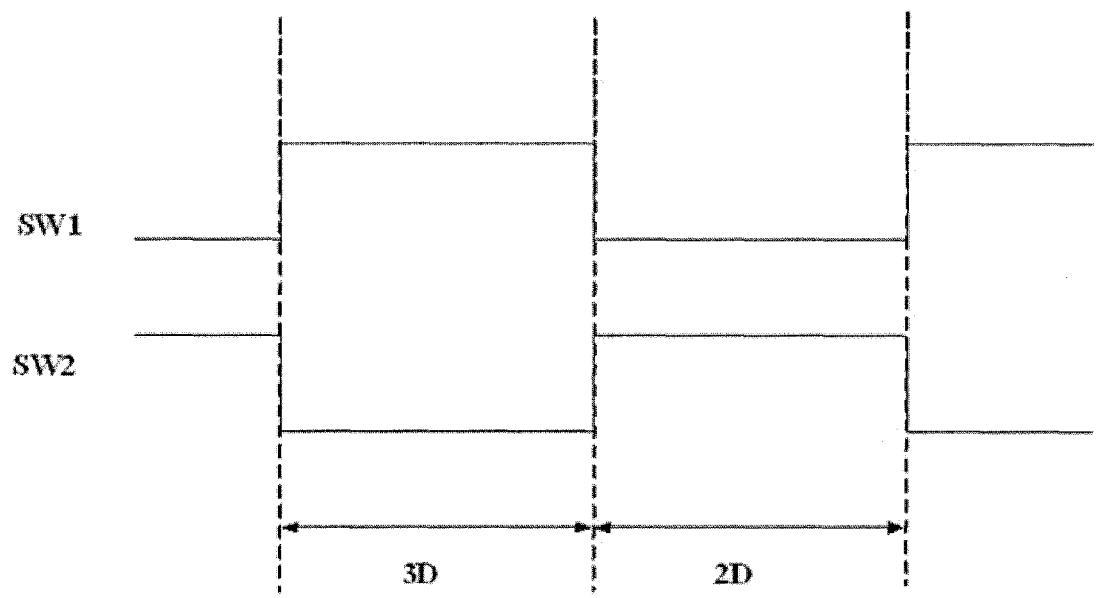
FIG. 1C is a diagram showing waveforms of a first control signal and a second control signal in 2D display mode and 3D display mode, respectively, according to an embodiment of the present invention.
Figure 3:
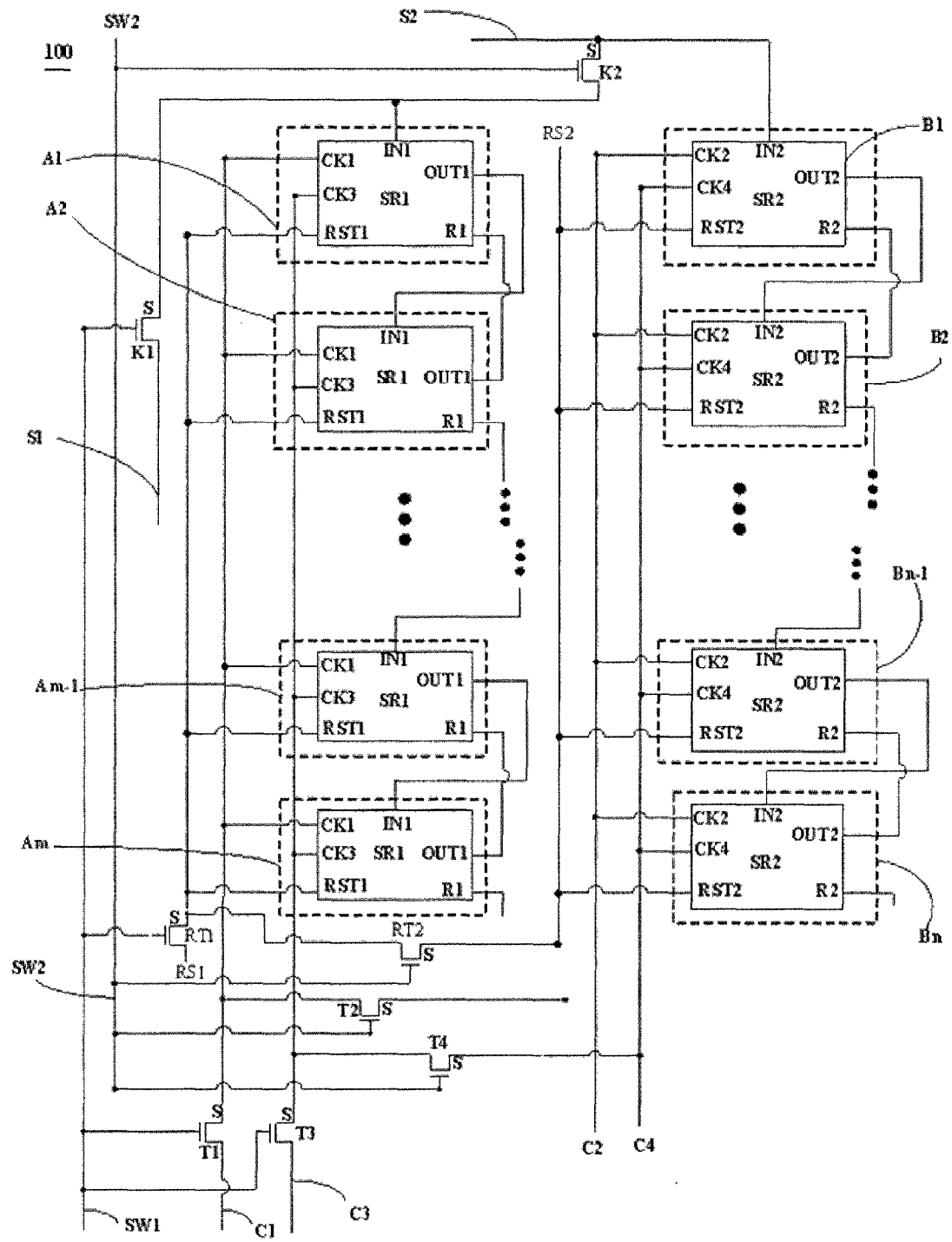
FIG. 3 is a schematic diagram showing the structure of a TFT array substrate according to an embodiment of the present invention.

The present disclosure further provides a second embodiment. As shown in FIGS. 1A, 1C and 3, parts in the second embodiment the same with those in the first embodiment are not described repeatedly. The second embodiment is based on the first embodiment, and a TFT array substrate 100 according to the second embodiment further includes: a first pre-scan reset line RS1, a second pre-scan reset line RS2, a first pre-scan reset transistor RT1 and a second pre-scan reset transistor RT2, each first shift register SR1 further includes a first pre-scan reset terminal RST1, and each second shift register SR2 further includes a second pre-scan reset terminal RST2, where, in each stage of first repeating unit A1, A2, . . . , Am, a drain electrode of the first pre-scan reset transistor RT1 is electrically connected to the first pre-scan reset line RS1, a gate electrode of the first pre-scan reset transistor RT1 is electrically connected to the first control line SW1, a source electrode s of the first pre-scan reset transistor RT1 is electrically connected to the first pre-scan reset terminal RST1, and the first pre-scan reset line RS1 is configured to output the first pre-scan reset signal for resetting the first repeating units A before scanning; and in each stage of second repeating unit B1, B2, . . . , Bn, a drain electrode of the second pre-scan reset transistor RT2 is electrically connected to the source electrode s of the first pre-scan reset transistor RT1, a gate electrode of the second pre-scan reset transistor RT2 is electrically connected to the second control line SW2, the second pre-scan reset terminal RST2 is electrically connected to the second pre-scan reset line RS2 via a source electrode s of the second pre-scan reset transistor RT2, and the second pre-scan reset line RS2 is configured to output the second pre-scan reset signal for resetting the second repeating units B before scanning; where, in 2D display mode, the first control line SW1 controls the first pre-scan reset transistor RT1 to be turned off, and the second control line SW2 controls the second pre-scan reset transistor RT2 to be turned on; and in 3D display mode, the first control line SW1 further controls the first pre-scan reset transistor RT1 to be turned on, and the second control line SW2 controls the second pre-scan reset transistor RT2 to be turned off.

It is noted that in the present embodiment, illustratively, the first signal line is the first pre-scan reset line, the second signal line is the second pre-scan reset line, the first transistor is the first pre-scan reset transistor, the second transistor is the second pre-scan reset transistor, the first shift register SR1 further includes the first pre-scan reset terminal, and the second shift register SR2 further includes the second pre-scan reset terminal, and the present disclosure is not limited thereto, as long as the following conditions are satisfied:

the TFT array substrate further includes: the first signal line, the second signal line, the first transistor and the second transistor, the first shift register further includes a first terminal, and the second shift register further includes a second terminal, where, in the each stage of first repeating unit A1, A2, . . . , Am, a drain electrode of the first transistor is electrically connected to the first signal line, a gate electrode of the first transistor is electrically connected to the first control line SW1, and a source electrode s of the first transistor is electrically connected to the first terminal of the first shift register;

in the each stage of second repeating unit B1, B2, . . . , Bn, a drain electrode of the second transistor is electrically connected to the source electrode s of the first transistor, a gate electrode of the second transistor is electrically connected to the second control line, and the second terminal of the second shift transistor is electrically connected to the second signal line via a source electrode s of the second transistor; where, in 2D display mode, the first control line controls the first transistor to be turned off, and the second control line controls the second transistor to be turned on; and in 3D display mode, the first control line controls the first transistor to be turned on, and the second control line controls the second transistor to be turned off.

The first signal line is configured to output a first pre-scan reset signal for resetting the first repeating units A before scanning, and the second signal line is configured to output a second pre-scan reset signal for resetting the second repeating units B before scanning;

or, the first signal line is configured to output a constant high level signal, and the second signal line is configured to output a constant low level signal;

or, the first signal line is configured to output a constant low level signal, and the second signal line is configured to output a constant high level signal;

or, the first signal line is configured to output a forward scanning signal, and the second signal line is also configured to output a forward scanning signal;

or, the first signal line is configured to output a backward scanning signal, and the second signal line is also configured to output a backward scanning signal.

Figure 4:
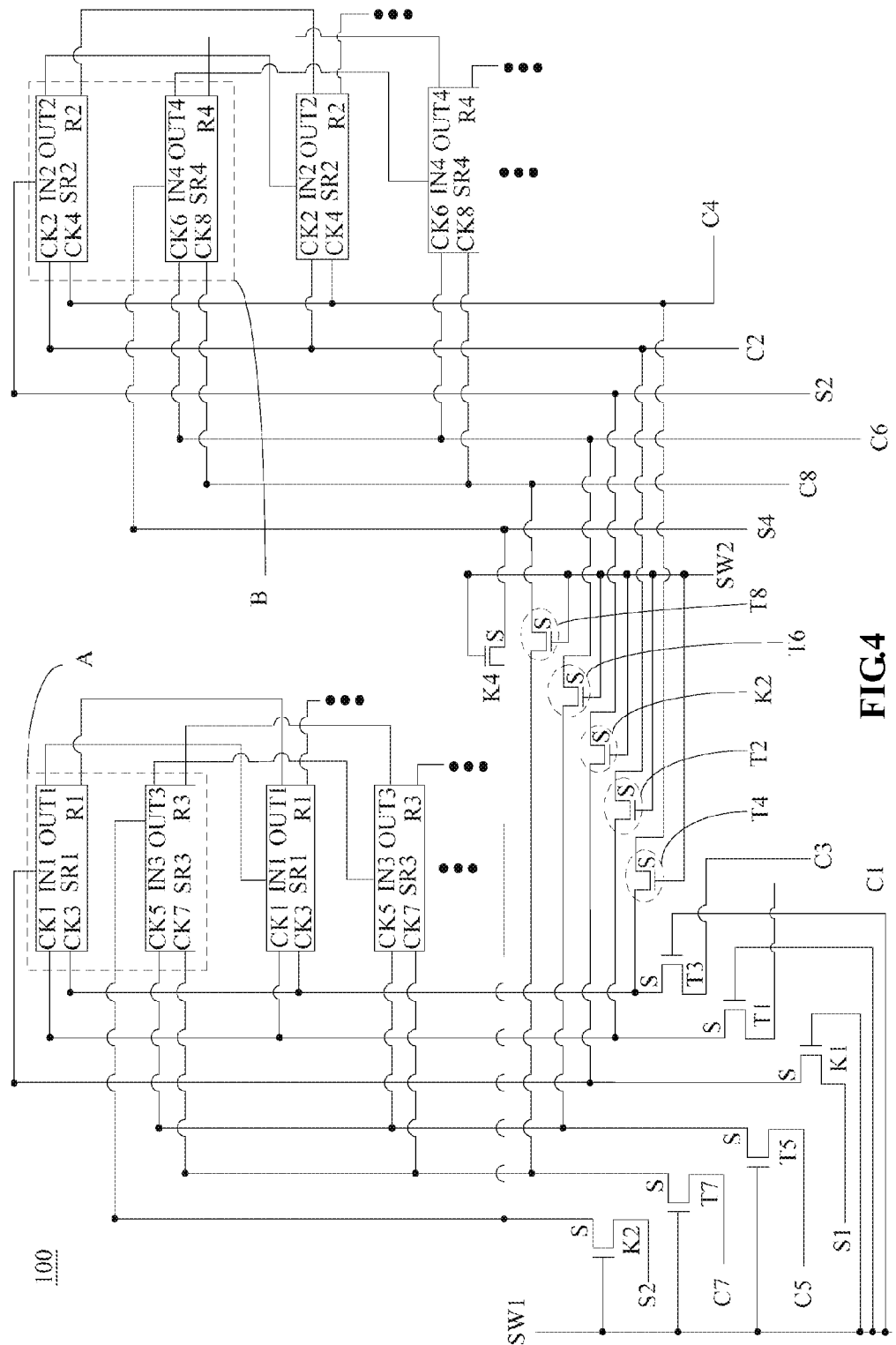
FIG. 4 is a schematic diagram showing the structure of a TFT array substrate according to an embodiment of the present invention.

The present disclosure further provides a third embodiment. As shown in FIGS. 1A, 1C and 4, parts in the third embodiment the same with those in the first embodiment are not described repeatedly. The third embodiment is based on the first embodiment, and in the TFT array substrate 100, each stage of first repeating unit A1, A2, . . . , Am further includes a third shift register SR3, and the third shift register SR3 includes a third input terminal IN3, a fifth clock signal terminal CK5, a seventh clock signal terminal CK7 and a third output terminal OUT3 connected to the corresponding gate line;

each stage of second repeating unit B1, B2, . . . , Bn further includes a fourth shift register SR4, and the fourth shift register SR4 includes a fourth input terminal IN4, a sixth clock signal terminal CK6, an eighth clock signal terminal CK8 and a fourth output terminal OUT4 connected to the corresponding gate line;

the TFT array substrate 100 further includes a third initial transistor K3, a fourth initial transistor K4, a fifth clock transistor T5, a sixth clock transistor T6, a seventh clock transistor T7, an eighth clock transistor T8, a fifth clock signal line C5, a sixth clock signal line C6, a seventh clock signal line C7, an eighth clock signal line C8, a third initial signal line S3 and a fourth initial signal line S4, where, in the first stage of first repeating unit A1, a drain electrode of the third initial transistor K3 is electrically connected to the third initial signal line S3, a source electrode s of the third initial transistor K3 is electrically connected to the third input terminal IN3, and a gate electrode of the third initial transistor K3 is electrically connected to the first control line SW1;

in the second to m-th stages of first repeating units A2 to Am, the third input terminal IN3 of the third shift register SR3 from the i-th stage of first repeating unit Ai is electrically connected to the third output terminal OUT3 of the third shift register SR3 from the (i−1)-th stage of first repeating unit A(i−1); for example, the third input terminal IN3 of the third shift register SR3 from the second stage of first repeating unit A2 is electrically connected to the third output terminal OUT3 of the third shift register SR3 from the first stage of first repeating unit A1;

in the first stage of second repeating unit B1, a drain electrode of the fourth initial transistor K4 is electrically connected to the fourth initial signal line S4, a source electrode s of the fourth initial transistor K4 is electrically connected to the fourth input terminal IN4, and a gate electrode of the fourth initial transistor K4 is electrically connected to the second control line SW2, the drain electrode of the fourth initial transistor K4 is electrically connected to the source electrode s of the third initial transistor K3, the fourth input terminal IN4 of the fourth shift register SR4 from the first stage of second repeating unit B1 is electrically connected to the fourth initial signal line S4 via the source electrode s of the fourth initial transistor K4, and the gate electrode of the fourth initial transistor K4 is electrically connected to the second control line SW2;

in the second to n-th stages of second repeating units B2 to Bn, the fourth input terminal IN4 of the fourth shift register SR4 from the j-th stage of second repeating unit Bj is electrically connected to the fourth output terminal OUT4 of the fourth shift register SR4 from the (j−1)-th stage of second repeating unit B(j−1); for example, the fourth input terminal IN4 of the fourth shift register SR4 from the second stage of second repeating unit B2 is electrically connected to the fourth output terminal OUT4 of the fourth shift register SR4 from the first stage of second repeating unit B1;

for each stage of first repeating unit A1, A2, . . . , Am, a drain electrode of the fifth clock transistor T5 is electrically connected to the fifth clock signal line C5, a gate electrode of the fifth clock transistor T5 is electrically connected to the first control line SW1, and a source electrode s of the fifth clock transistor T5 is electrically connected to the fifth clock signal terminal CK5;

a drain electrode of the seventh clock transistor T7 is electrically connected to the seventh clock signal line C7, a gate electrode of the seventh clock transistor T7 is electrically connected to the first control line SW1, and a source electrode s of the seventh clock transistor T7 is electrically connected to the seventh clock signal terminal CK7;

for each stage of second repeating unit B1, B2, . . . , Bn, a drain electrode of the sixth clock transistor T6 is electrically connected to the source electrode s of the fifth clock transistor T5, a gate electrode of the sixth clock transistor T6 is electrically connected to the second control line SW2, and the sixth clock signal terminal CK6 is electrically connected to the sixth clock signal line C6 via a source electrode s of the sixth clock transistor T6;

a drain electrode of the eighth clock transistor T8 is electrically connected to the source electrode s of the seventh clock transistor T7, a gate electrode of the eighth clock transistor T8 is electrically connected to the second control line SW2, and the eighth clock signal terminal CK8 is electrically connected to the eighth clock signal line C8 via a source electrode s of the eighth clock transistor T8;

in 2D display mode, the first control line SW1 further controls the third initial transistor K3, the fifth clock transistor T5 and the seventh clock transistor T7 to be turned off, and the second control line SW2 controls the fourth initial transistor K4, the sixth clock transistor T6 and the eighth clock transistor T8 to be turned on;

in 3D display mode, the first control line SW1 further controls the third initial transistor K3, the fifth clock transistor T5 and the seventh clock transistor T7 to be turned on, and the second control line SW2 controls the fourth initial transistor K4, the sixth clock transistor T6 and the eighth clock transistor T8 to be turned off.

specifically, the fifth clock signal line C5, the sixth clock signal line C6, the seventh clock signal line C7 and the eighth clock signal line C8 are configured to output the fifth clock signal, the sixth clock signal, the seventh clock signal and the eighth clock signal, respectively, where, the fifth clock signal is inverse to the seventh clock signal, and the sixth clock signal is inverse to the eighth clock signal.

Further, each of the third shift registers SR3 further includes a third clear terminal R3, and each of the fourth shift register SR4 further includes a fourth clear terminal R4, where, the third clear terminal R3 of the third shift register SR3 from the k-th stage of first repeating unit Ak is electrically connected to the third output terminal OUT3 of the third shift register SR3 from the (k+1)-th stage of first repeating unit A(k+1); for example, the third clear terminal R3 of the third shift register SR3 from the first stage of first repeating unit A1 is electrically connected to the third output terminal OUT3 of the third shift register SR3 from the second stage of first repeating unit A2;

the fourth clear terminal R4 of the fourth shift register SR4 from the p-th stage of second repeating unit Bp is electrically connected to the fourth output terminal OUT4 of the fourth shift register SR4 from the (p+1)-th stage of second repeating unit B(p+1); for example, the fourth clear terminal R4 of the fourth shift register SR4 from the first stage of second repeating unit B1 is electrically connected to the fourth output terminal OUT4 of the fourth shift register SR4 from the second stage of second repeating unit B2; where, k and p are positive integers, and $1 \leq k \leq (m-1)$, $1 \leq p \leq (n-1)$.

In the present embodiment, in 2D display mode, the first control line further controls the third initial transistor, the fifth clock transistor and the seventh clock transistor to be turned off; and the second control line further controls the fourth initial transistor, the sixth clock transistor and the eighth clock transistor to be turned on; and in 3D display mode, the first control line further controls the third initial transistor, the fifth clock transistor and the seventh clock transistor to be turned on; and the second control line further controls the fourth initial transistor, the sixth clock transistor and the eighth clock transistor to be turned off, so that mutual conversion between the 2D display mode and the 3D display mode is convenient in the display device.

Figure 5:
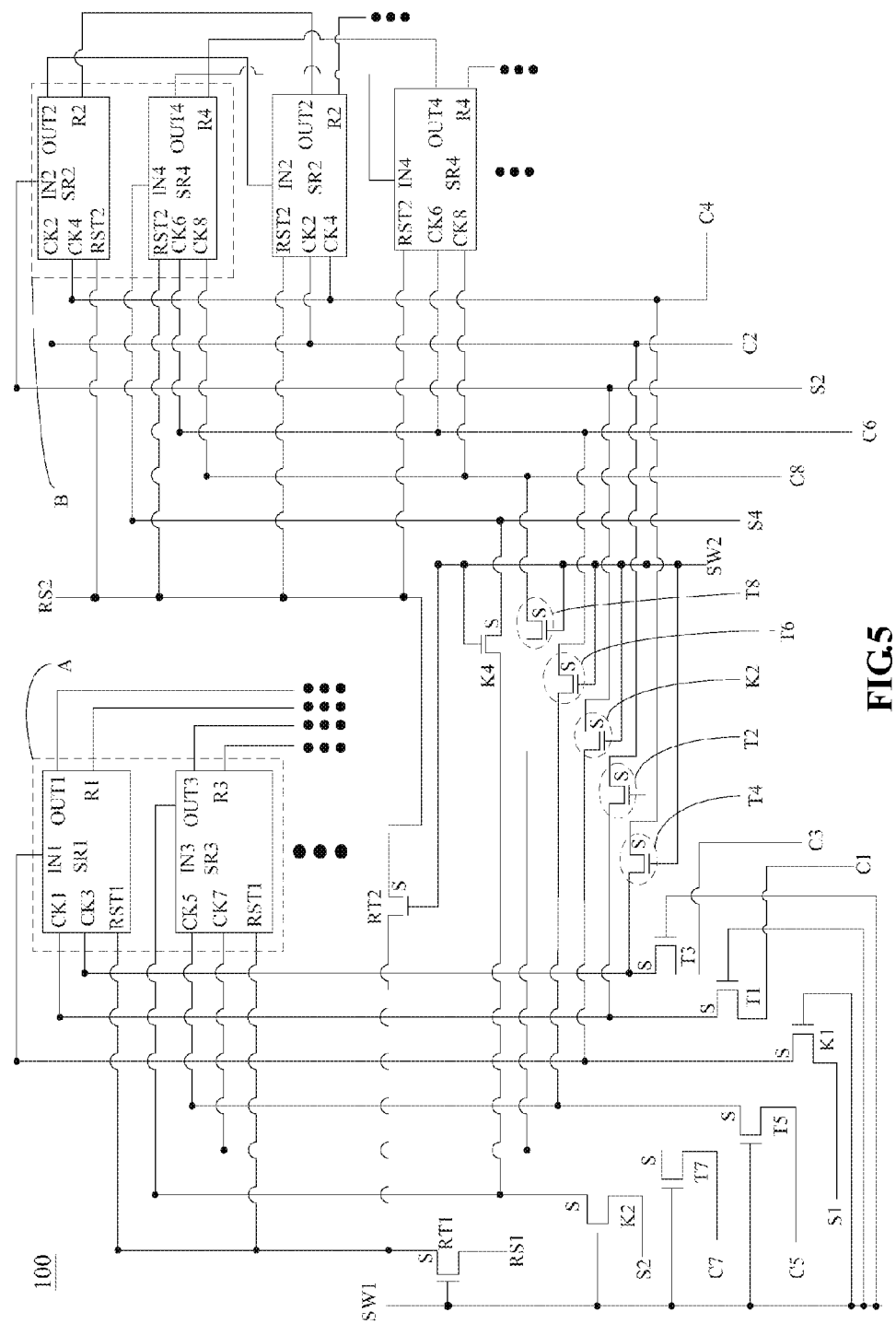
FIG. 5 is a schematic diagram showing the structure of a TFT array substrate according to an embodiment of the present invention.

The present disclosure further provides a fourth embodiment. As shown in FIGS. 1A, 1C and 5, parts of the fourth embodiment the same with those in the third embodiment are not described repeatedly. The fourth embodiment is based on the third embodiment, and a TFT array substrate 100 further includes: a first pre-scan reset line RS1, a second pre-scan reset line RS2, a first pre-scan reset transistor RT1 and a second pre-scan reset transistor RT2, each first shift register SR1 further includes a first pre-scan reset terminal RST1, each third shift register SR3 further includes a first pre-scan reset terminal RST1, each second shift register SR2 further includes a second pre-scan reset terminal RST2, and each fourth shift register SR4 further includes a second pre-scan reset terminal RST2, where, in each stage of first repeating unit A1, A2, . . . , Am, a drain electrode of the first pre-scan reset transistor RT1 is electrically connected to the first pre-scan reset line RS1, a gate electrode of the first pre-scan reset transistor RT1 is electrically connected to the first control line SW1, a source electrode s of the first pre-scan reset terminal RT1 is electrically connected to each first pre-scan reset terminals RST1, and the first pre-scan reset line RS1 is configured to output the first pre-scan reset signal for resetting the first repeating units A before scanning; and in each stage of second repeating unit B1, B2, . . . , Bn, a drain electrode of the second pre-scan reset transistor RT2 is electrically connected to the source electrode s of the first pre-scan reset transistor RT1, a gate electrode of the second pre-scan reset transistor RT2 is electrically connected to the second control line SW2, each second pre-scan reset terminal RST2 is electrically connected to the second pre-scan reset line RS2 via a source electrode s of the second pre-scan reset transistor RT2, and the first pre-scan reset line RS2 is configured to output the second pre-scan reset signal for resetting the second repeating units B before scanning; where, in 2D display mode, the first control line SW1 controls the first pre-scan reset transistor RT1 to be turned off, and the second control line SW2 controls the second pre-scan reset transistor RT2 to be turned on;

in 3D display mode, the first control line SW1 further controls the first pre-scan reset transistor RT1 to be turned on, and the second control line SW2 controls the second pre-scan reset transistor RT2 to be turned off.

It is noted that in the present embodiment, illustratively, the first signal line is the first pre-scan reset line, the second signal line is the second pre-scan reset line, the first transistor is the first pre-scan reset transistor, the second transistor is the second pre-scan reset transistor, the first shift register SR1 further includes the first pre-scan reset terminal, and the second shift register SR2 further includes the second pre-scan reset terminal, but the present disclosure is limited thereto, as long as the following conditions are satisfied:

the TFT array substrate 100 further includes: the first signal line, the second signal line, the first transistor and the second transistor, each of the first shift register SR1 and the third shift register SR3 further includes a first terminal, and each of the second shift register SR2 and the fourth shift register SR4 further include a second terminal, where, in the each stage of first repeating unit A1, A2, . . . , Am, a drain electrode of the first transistor is electrically connected to the first signal line, a gate electrode of the first transistor is electrically connected to the first control line SW1, and a source electrode s of the first transistor is electrically connected to the first terminals of the first shift register and the third shift register;

in the each stage of second repeating unit B1, B2, . . . , Bn, a drain electrode of the second transistor is electrically connected to the source electrode s of the first transistor, a gate electrode of the second transistor is electrically connected to the second control line SW2, and the second terminals of the second shift transistor and the fourth shift transistor are electrically connected to the second signal line via a source electrode s of the second transistor; where, in 2D display mode, the first control line SW1 controls the first transistor to be turned off, and the second control line SW2 controls the second transistor to be turned on; and in 3D display mode, the first control line SW1 controls the first transistor to be turned on, and the second control line SW2 controls the second transistor to be turned off the first signal line is configured to output a first pre-scan reset signal for resetting the first repeating units A before scanning, and the second signal line is configured to output a second pre-scan reset signal for resetting the second repeating units B before scanning;

or, the first signal line is configured to output a constant high level signal, and the second signal line is configured to output a constant low level signal;

or, the first signal line is configured to output a constant low level signal, and the second signal line is configured to output a constant high level signal;

or, the first signal line is configured to output a forward scanning signal, and the second signal line is also configured to output a forward scanning signal;

or, the first signal line is configured to output a backward scanning signal, and the second signal line is also configured to output a backward scanning signal.

Figure 6:
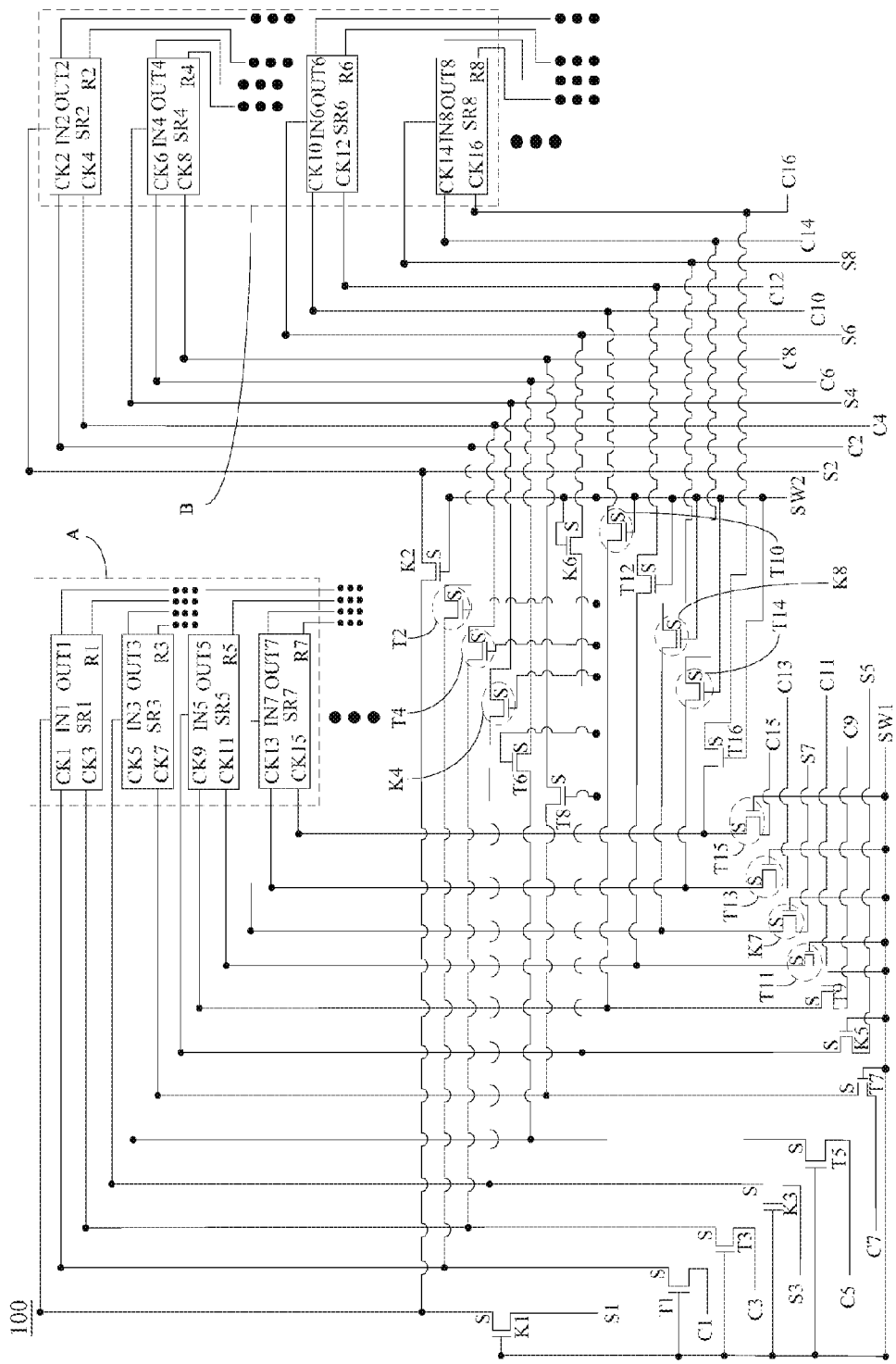
FIG. 6 is a schematic diagram showing the structure of a TFT array substrate according to an embodiment of the present invention.
Figure 6A:
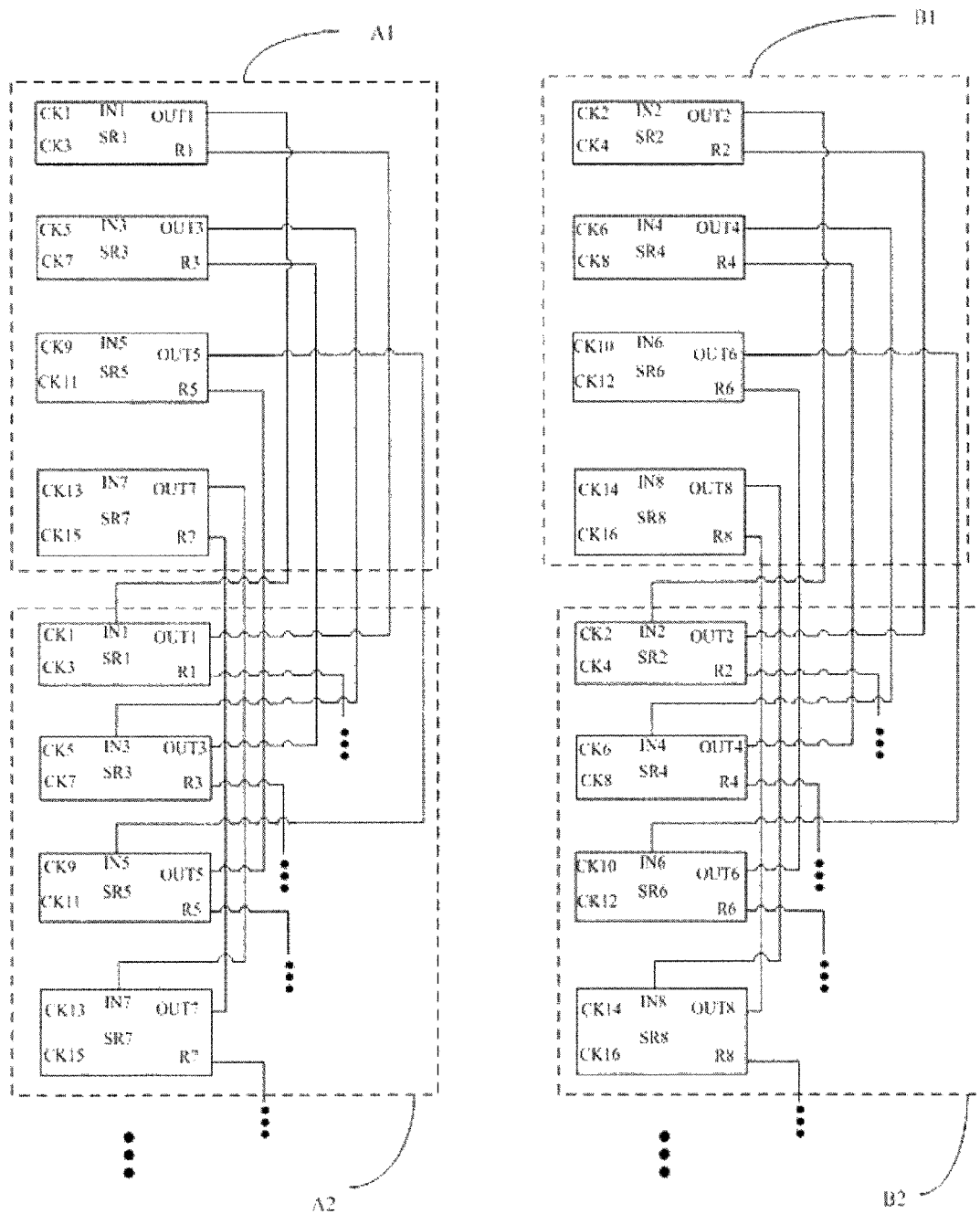
FIG. 6A is a schematic diagram showing the connection configuration of the stage of repeating units shown in FIG. 6.

The present disclosure further provides a fifth embodiment. As shown in FIGS. 1A, 1C and 6, parts in the fifth embodiment the same with those in the third embodiment are not described repeatedly. The fifth embodiment is based on the third embodiment and in the TFT array substrate 100, each stage of first repeating unit A1, A2, . . . , Am further includes a fifth shift register SR5 and a seventh shift register SR7, and the fifth shift register SR5 includes a fifth input terminal IN5, a ninth clock signal terminal CK9, an eleventh clock signal terminal CK11 and a fifth output terminal OUT5 connected to the corresponding gate line. and the seventh shift register SR7 includes a seventh input terminal IN7, a thirteenth clock signal terminal CK13, a fifteenth clock signal terminal CK15 and a seventh output terminal OUT7 connected to the corresponding gate line;

each stage of second repeating unit B1, B2, . . . , Bn further includes a sixth shift register SR6 and an eighth shift register SR8, and the sixth shift register SR6 includes a sixth input terminal IN6, a tenth clock signal terminal CK10, a twelfth clock signal terminal CK12 and a sixth output terminal OUT6 connected to the corresponding gate line, and the eighth shift register SR8 includes an eighth input terminal IN8, a fourteenth clock signal terminal CK14, a sixteenth clock signal terminal CK16 and an eighth output terminal OUT8 connected to the corresponding gate line;

the TFT array substrate 100 further includes a fifth initial transistor K5, a sixth initial transistor K6, a ninth clock transistor T9, a tenth clock transistor T10, an eleventh clock transistor T11, a twelfth clock transistor T12, a ninth clock signal line C9, a tenth clock signal line C10, an eleventh clock signal line C11, a twelfth clock signal line C12, a fifth initial signal line S5 and a sixth initial signal line S6; and the TFT array substrate 100 further includes a seventh initial transistor K7, an eighth initial transistor K8, a thirteenth clock transistor T13, a fourteenth clock transistor T14, a fifteenth clock transistor T15, a sixteenth clock transistor T16, a thirteenth clock signal line C13, a fourteenth clock signal line C14, a fifteenth clock signal line C15, a sixteenth clock signal line C16, a seventh initial signal line S7 and an eighth initial signal line S8, where, in the first stage of first repeating unit A1, a drain electrode of the fifth initial transistor K5 is electrically connected to the fifth initial signal line S5, a source electrode s of the fifth initial transistor K5 is electrically connected to the fifth input terminal IN5, and a gate electrode of the fifth initial transistor K5 is electrically connected to the first control line SW1; a drain electrode of the seventh initial transistor K7 is electrically connected to the seventh initial signal line S7, a source electrode s of the seventh initial transistor K7 is electrically connected to the seventh input terminal IN7, and a gate electrode of the seventh initial transistor K7 is electrically connected to the first control line SW1;

in the second to m-th stages of first repeating units A2 to Am, the fifth input terminal IN5 of the fifth shift register SR5 from the i-th stage of first repeating unit Ai is electrically connected to the fifth output terminal OUT5 of the fifth shift register SR5 from the (i−1)-th stage of first repeating unit A(i−1), and the seventh input terminal IN7 of the seventh shift register SR7 from the i-th stage of first repeating unit Ai is electrically connected to the seventh output terminal OUT7 of the seventh shift register SR7 from the (i−1)-th stage of first repeating unit A(i−1); for example, as shown in FIG. 6A, in the second stage of first repeating unit A2, the fifth input terminal IN5 of the fifth shift register SR5 from the second stage of first repeating unit A2 is electrically connected to the fifth output terminal OUT5 of the fifth shift register SR5 from the first stage of first repeating unit A1, and the seventh input terminal IN7 of the seventh shift register SR7 from the second stage of first repeating unit A2 is electrically connected to the seventh output terminal OUT7 of the seventh shift register SR7 from the first stage of first repeating unit A1;

in the first stage of second repeating unit B1, a drain electrode of the sixth initial transistor K6 is electrically connected to the source electrode s of the fifth initial transistor K5, the sixth input terminal IN6 of the sixth shift register SR6 from the first stage of second repeating unit B1 is electrically connected to the sixth initial signal line S6 via a source electrode s of the sixth initial transistor K6, and the gate electrode of the sixth initial transistor K6 is electrically connected to the second control line SW2; a drain electrode of the eighth initial transistor K8 is electrically connected to the source electrode s of the seventh initial transistor K7, the eighth input terminal IN8 of the eighth shift register SR8 from the first stage of second repeating unit B1 is electrically connected to the eighth initial signal line S8 via a source electrode s of the eighth initial transistor K8, and the gate electrode of the eighth initial transistor K8 is electrically connected to the second control line;

in the second to n-th stages of second repeating units B2 to Bn, the sixth input terminal IN6 of the sixth shift register SR6 from the j-th stage of second repeating unit Bj is electrically connected to the sixth output terminal OUT6 of the sixth shift register SR6 from the (j−1)-th stage of second repeating unit B(j−1), and the eighth input terminal IN8 of the eighth shift register SR8 from the j-th stage of second repeating unit Bj is electrically connected to the eighth output terminal OUT8 of the eighth shift register SR8 from the (j−1)-th stage of second repeating unit B(j−1); for example, as shown in FIG. 6A, in the second stage of second repeating unit B2, the sixth input terminal IN6 of the sixth shift register SR6 from the second stage of second repeating unit B2 is electrically connected to the sixth output terminal OUT6 of the sixth shift register SR6 from the first stage of second repeating unit B1, and the eighth input terminal IN8 of the eighth shift register SR8 from the second stage of second repeating unit B2 is electrically connected to the eighth output terminal OUT8 of the eighth shift register SR8 from the first stage of second repeating unit B1;

for each stage of first repeating unit A1, A2, . . . , Am a drain electrode of the ninth clock transistor T9 is electrically connected to the ninth clock signal line C9, a gate electrode of the ninth clock transistor T9 is electrically connected to the first control line SW1, and a source electrode s of the ninth clock transistor T9 is electrically connected to the ninth clock signal terminal CK9;

a drain electrode of the eleventh clock transistor T11 is electrically connected to the eleventh clock signal line C11, a gate electrode of the eleventh clock transistor T11 is electrically connected to the first control line SW1, and a source electrode s of the eleventh clock transistor T11 is electrically connected to the eleventh clock signal terminal CK11;

a drain electrode of the thirteenth clock transistor T13 is electrically connected to the thirteenth clock signal line C13, a gate electrode of the thirteenth clock transistor T13 is electrically connected to the first control line SW1, and a source electrode s of the thirteenth clock transistor T13 is electrically connected to the thirteenth clock signal terminal CK13;

a drain electrode of the fifteenth clock transistor T15 is electrically connected to the fifteenth clock signal line C15, a gate electrode of the fifteenth clock transistor T15 is electrically connected to the first control line SW1, and a source electrode s of the fifteenth clock transistor T15 is electrically connected to the fifteenth clock signal terminal CK15;

for each stage of second repeating unit B1, B2, . . . , Bn, a drain electrode of the tenth clock transistor T10 is electrically connected to the source electrode s of the ninth clock transistor T9, a gate electrode of the tenth clock transistor T10 is electrically connected to the second control line SW2, and the tenth clock signal terminal CK10 is electrically connected to the tenth clock signal line C10 via a source electrode s of the tenth clock transistor T10;

a drain electrode of the twelfth clock transistor T12 is electrically connected to the source electrode s of the eleventh clock transistor T11, a gate electrode of the twelfth clock transistor T12 is electrically connected to the second control line SW2, and the twelfth clock signal terminal CK12 is electrically connected to the twelfth clock signal line C12 via a source electrode s of the twelfth clock transistor T12;

a drain electrode of the fourteenth clock transistor T14 is electrically connected to the source electrode s of the thirteenth clock transistor T13, a gate electrode of the fourteenth clock transistor T14 is electrically connected to the second control line SW2, and the fourteenth clock signal terminal CK14 is electrically connected to the fourteenth clock signal line C14 via a source electrode s of the fourteenth clock transistor T14;

a drain electrode of the sixteenth clock transistor T16 is electrically connected to the source electrode s of the fifteenth clock transistor T15, a gate electrode of the sixteenth clock transistor T16 is electrically connected to the second control line SW2, and the sixteenth clock signal terminal CK16 is electrically connected to the sixteenth clock signal line C16 via a source electrode s of the sixteenth clock transistor T16; where in 2D display mode, the first control line SW1 further controls the fifth initial transistor K5, the ninth clock transistor T9, the eleventh clock transistor T11, the seventh initial transistor K7, the thirteenth clock transistor T13, and the fifteenth clock transistor T15 to be turned off, and the second control line SW2 further controls the sixth initial transistor K6, the tenth clock transistor T10, the twelfth clock transistor T12, the eighth initial transistor K8, the fourteenth clock transistor T14, and the sixteenth clock transistor T16 to be turned on;

in 3D display mode, the first control line SW1 further controls the fifth initial transistor K5, the ninth clock transistor T9, the eleventh clock transistor T11, the seventh initial transistor K7, the thirteenth clock transistor T13, and the fifteenth clock transistor T15 to be turned on, and the second control line SW2 further controls the sixth initial transistor K6, the tenth clock transistor T10, the twelfth clock transistor T12, the eighth initial transistor K8, the fourteenth clock transistor T14, and the sixteenth clock transistor T16 to be turned off Specifically, the ninth clock signal line C9, the tenth clock signal line C10, the eleventh clock signal line C11 and the twelfth clock signal line C12 are configured to output the ninth clock signal, the tenth clock signal, the eleventh clock signal and the twelfth clock signal, respectively; The thirteenth clock signal line C13, the fourteenth clock signal line C14, the fifteenth clock signal line C15 and the sixteenth clock signal line C16 are configured to output the thirteenth clock signal, the fourteenth clock signal, the fifteenth clock signal and the sixteenth clock signal, respectively, where the ninth clock signal is inverse to the eleventh clock signal, the tenth clock signal is inverse to the twelfth clock signal, the thirteenth clock signal is inverse to the fifteenth clock signal, and the fourteenth clock signal is inverse to the sixteenth clock signal.

Further, each fifth shift registers SR5 further includes a fifth clear terminal R5, each sixth shift registers SR6 further includes a sixth clear terminal R6, each seventh shift registers SR7 further includes a seventh clear terminal R7, and each eighth shift registers SR8 further includes an eighth clear terminal R8, where, the fifth clear terminal R5 of the fifth shift register SR5 from the k-th stage of first repeating unit Ak is electrically connected to the fifth output terminal OUT5 of the fifth shift register SR5 from the (k+1)-th stage of first repeating unit A(k+1), and the seventh clear terminal R7 of the seventh shift register SR7 from the k-th stage of first repeating unit Ak is electrically connected to the seventh output terminal OUT7 of the seventh shift register SR7 from the (k+1)-th stage of first repeating unit A(k+1), the sixth clear terminal R6 of the sixth shift register SR6 from the p-th stage of second repeating unit Bp is electrically connected to the sixth output terminal OUT6 of the sixth shift register SR6 from the (p+1)-th stage of second repeating unit B(p+1), and the eighth clear terminal R8 of the eighth shift register SR8 from the p-th stage of second repeating unit Bp is electrically connected to the eighth output terminal OUT8 of the eighth shift register SR8 from the (p+1)-th stage of second repeating unit B(p+1).

In the present embodiment, in 2D display mode, the first control line further controls the fifth initial transistor, the ninth clock transistor, the eleventh clock transistor, the seventh initial transistor, the thirteenth clock transistor and the fifteenth clock transistor to be turned off; and the second control line further controls the sixth initial transistor, the tenth clock transistor, the twelfth clock transistor, the eighth initial transistor, the fourteenth clock transistor and the sixteenth clock transistor to be turned on; and in 3D display mode, the first control line further controls the fifth initial transistor, the ninth clock transistor, the eleventh clock transistor, the seventh initial transistor, the thirteenth clock transistor and the fifteenth clock transistor to be turned on; and the second control line further controls the sixth initial transistor, the tenth clock transistor, the twelfth clock transistor, the eighth initial transistor, the fourteenth clock transistor and the sixteenth clock transistor to be turned off, so that mutual conversion between the 2D display mode and the 3D display mode is convenient in the display device.

Figure 7:
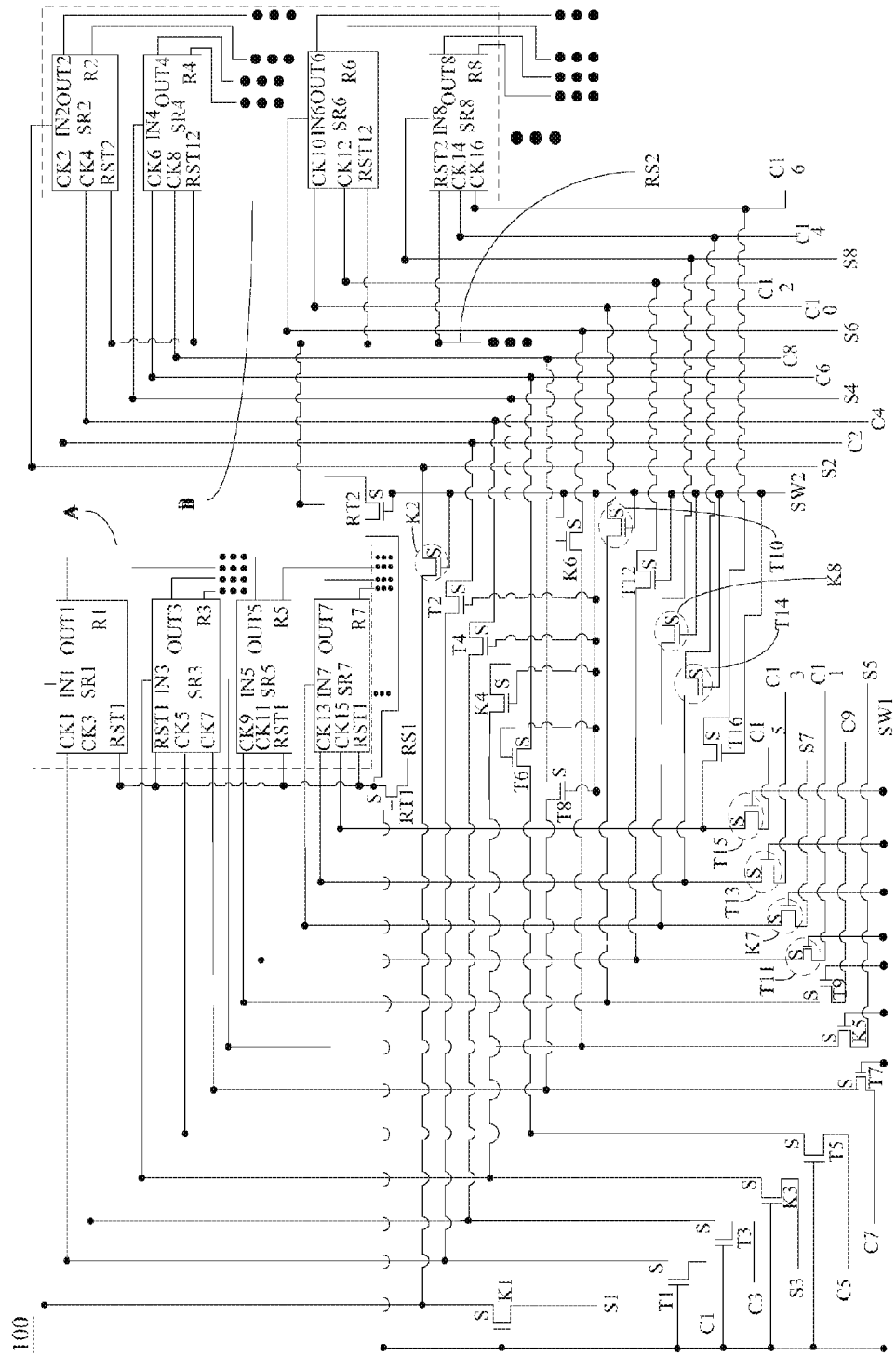
FIG. 7 is a schematic diagram showing the structure of a TFT array substrate according to an embodiment of the present invention.

The present disclosure further provides a sixth embodiment. As shown in FIGS. 1A, 1C and 7, parts of the sixth embodiment the same with those in the fifth embodiment are not described repeatedly. The sixth embodiment is based on the fifth embodiment, and a TFT array substrate 100 further includes:

a first pre-scan reset line RS1, a second pre-scan reset line RS2, a first pre-scan reset transistor RT1 and a second pre-scan reset transistor RT2, each first shift registers SR1 further includes a first pre-scan reset terminal RST1, each third shift registers SR3 further includes a first pre-scan reset terminal RST1, each fifth shift registers SR5 further includes a first pre-scan reset terminal RST1, each seventh shift registers SR7 further includes a first pre-scan reset terminal RST1, each second shift registers SR2 further includes a second pre-scan reset terminal RST2, and each fourth shift registers SR4 further includes a second pre-scan reset terminal RST2, each sixth shift registers SR6 further includes a second pre-scan reset terminal RST2, and each eighth shift registers SR8 further includes a second pre-scan reset terminal RST2, where, in each stage of first repeating unit A1, A2, . . . , Am, a drain electrode of the first pre-scan reset transistor RT1 is electrically connected to the first pre-scan reset line RS1, a gate electrode of the first pre-scan reset transistor RT1 is electrically connected to the first control line SW1, a source electrode s of the first pre-scan reset terminal RT1 is electrically connected to each first pre-scan reset terminals RST1, and the first pre-scan reset line RS1 is configured to output a first pre-scan reset signal for resetting the first repeating units A before scanning; and in each stage of second repeating unit B1, B2, . . . , Bn, a drain electrode of the second pre-scan reset transistor RT2 is electrically connected to the source electrode s of the first pre-scan reset transistor RT1, a gate electrode of the second pre-scan reset transistor RT2 is electrically connected to the second control line SW2, each of the second pre-scan reset terminals RST2 is electrically connected to the second pre-scan reset line RS2 via a source electrode s of the second pre-scan reset transistor RT2, and the second pre-scan reset line RS2 is configured to output a second pre-scan reset signal for resetting the second repeating units B before scanning; where, in 2D display mode, the first control line SW1 controls the first pre-scan reset transistor RT1 to be turned off, and the second control line SW2 controls the second pre-scan reset transistor RT2 to be turned on;

in 3D display mode, the first control line SW1 further controls the first pre-scan reset transistor RT1 to be turned on, and the second control line SW2 controls the second pre-scan reset transistor RT2 to be turned off.

It is noted that in the present embodiment, illustratively, the first signal line is the first pre-scan reset line, the second signal line is the second pre-scan reset line, the first transistor is the first pre-scan reset transistor, the second transistor is the second pre-scan reset transistor, the first shift register SR1 further includes the first pre-scan reset terminal, and the second shift register SR2 further includes the second pre-scan reset terminal, but the present disclosure is not limited thereto, as long as the following conditions are satisfied:

the TFT array substrate 100 further includes: the first signal line, the second signal line, the first transistor and the second transistor, and each of the first shift register SR1, the third shift register SR3, the fifth shift register SR5 and the seventh shift register SR7 further includes a first terminal, and each of the second shift register SR2, the fourth shift register SR4, the sixth shift register SR6, and the eighth shift register SR8 further includes a second terminal, where, in the each stage of first repeating unit A1, A2, . . . , Am, a drain electrode of the first transistor is electrically connected to the first signal line, a gate electrode of the first transistor is electrically connected to the first control line SW1, and a source electrode s of the first transistor is electrically connected to the first terminals of the first shift register SR1, the third shift register SR3, the fifth shift register SR5 and the seventh shift register SR7;

in the each stage of second repeating unit B1, B2, . . . , Bn, a drain electrode of the second transistor is electrically connected to the source electrode s of the first transistor, a gate electrode of the second transistor is electrically connected to the second control line SW2, and the second terminals of the second shift register SR2, the fourth shift register SR4, the sixth shift register SR6, and the eighth shift register SR8 are electrically connected to the second signal line via a source electrode s of the second transistor; where, in 2D display mode, the first control line SW1 controls the first transistor to be turned off, and the second control line SW2 controls the second transistor to be turned on; and in 3D display mode, the first control line SW1 controls the first transistor to be turned on, and the second control line SW2 controls the second transistor to be turned off The first signal line is configured to output a first pre-scan reset signal for resetting the first repeating units A before scanning, and the second signal line is configured to output a second pre-scan reset signal for resetting the second repeating units B before scanning;

or, the first signal line is configured to output a constant high level signal, and the second signal line is configured to output a constant low level signal;

or, the first signal line is configured to output a constant low level signal, and the second signal line is configured to output a constant high level signal;

or, the first signal line is configured to output a forward scanning signal, and the second signal line is also configured to output a forward scanning signal;

or, the first signal line is configured to output a backward scanning signal, and the second signal line is also configured to output a backward scanning signal.

Figure 8:
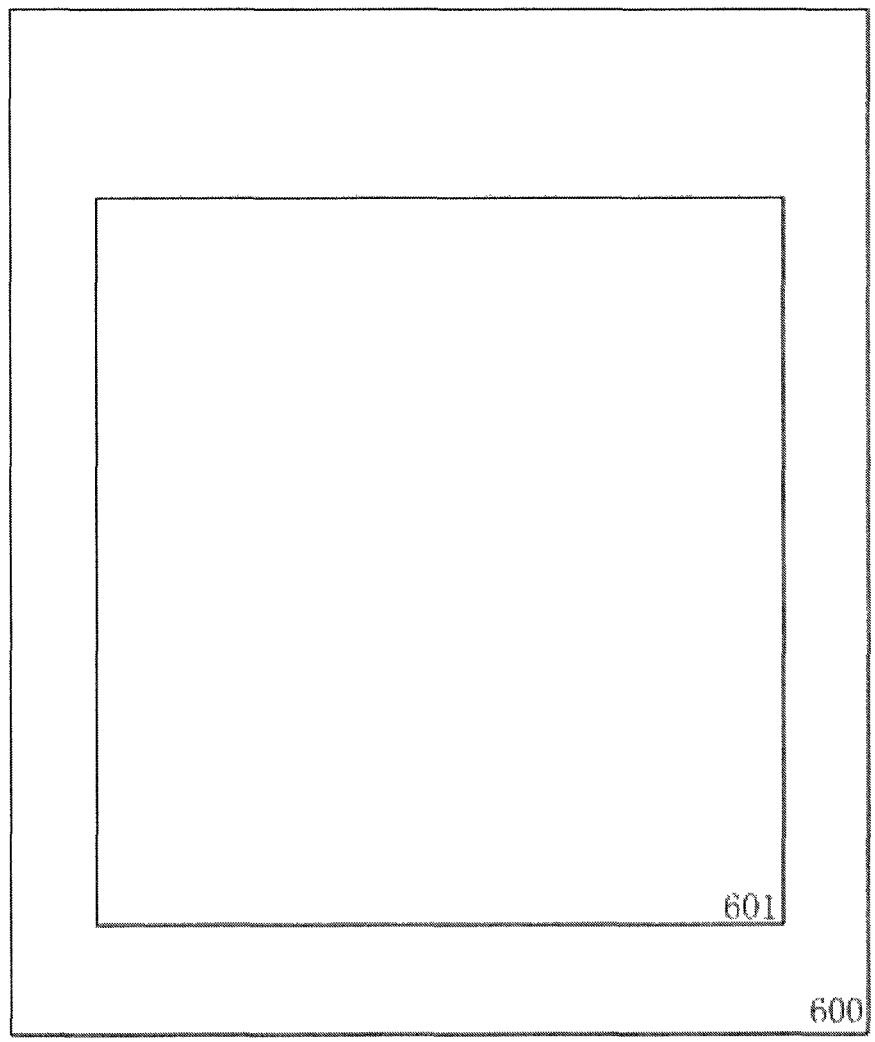
FIG. 8 is a schematic diagram showing the structure of a display panel according to an embodiment of the present invention.

The present disclosure further provides a seventh embodiment, and FIG. 8 is a schematic diagram showing the structure of a display panel according to the seventh embodiment of the present invention. As shown in FIG. 8, the display panel 600 in the present embodiment further includes a TFT array substrate 601 which may be the TFT array substrate according to any of above embodiments.

Figure 9:
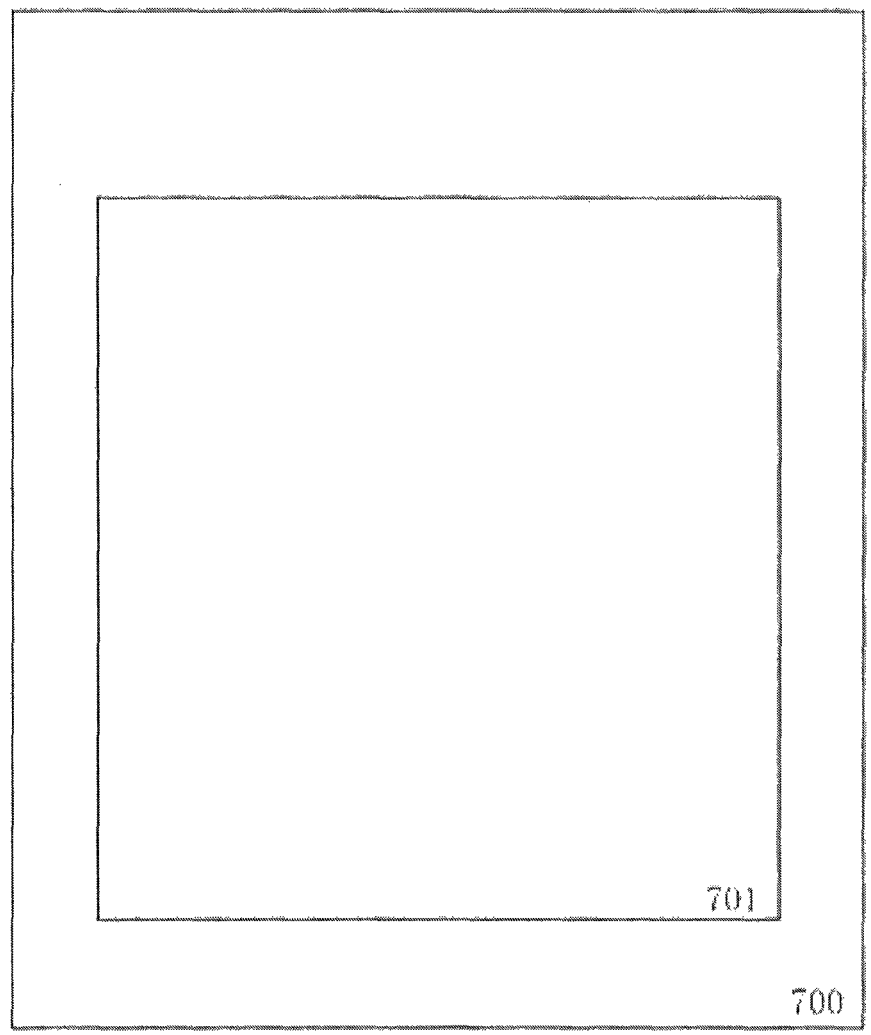
FIG. 9 is a schematic diagram showing the structure of a display device according to an embodiment of the present invention.

The present disclosure further provides an eighth embodiment, and FIG. 9 is s schematic diagram showing the structure of a display device according to the eighth embodiment of the present invention. As shown in FIG. 9, the display device in the eighth embodiment of the present invention is not limited to a display device such as an OLED, an LCD or an electric paper. Specifically, the display device 700 includes a TFT array substrate 701. The TFT array substrate 701 may be the TFT array substrate according to any of above embodiments.

From the above, with the TFT array substrate, the display panel and the display device according to the embodiments of the present invention, the first input terminal from the first stage of first repeating unit is electrically connected to the first initial signal line via both the source electrode and the drain electrode of the first initial transistor, the gate electrode of the first initial transistor is electrically connected to the first control line, the second input terminal from the first stage of second repeating unit is electrically connected to the second initial signal line via the source electrode of the second initial transistor, the drain electrode of the second initial transistor is electrically connected to the source electrode of the first initial transistor, and the gate electrode of the second initial transistor is electrically connected to the second control line; and for each stage of first repeating unit and each stage of second repeating unit, the first clock signal terminal is electrically connected to the first clock signal line via both source electrode and the drain electrode of the first clock transistor, and the gate electrode of the first clock transistor is electrically connected to the first control line; the second clock signal terminal is electrically connected to the second clock signal line via both source electrode and the drain electrode of the second clock transistor, and the gate electrode of the second clock transistor is electrically connected to the first control line; the third clock signal terminal is electrically connected to the third clock signal line via both source electrode and the drain electrode of the third clock transistor, and the gate electrode of the third clock transistor is electrically connected to the first control line; the fourth clock signal terminal is electrically connected to the fourth clock signal line via both source electrode and the drain electrode of the fourth clock transistor, and the gate electrode of the fourth clock transistor is electrically connected to the first control line; where in 2D display mode, the first control line controls the first initial transistor, the first clock transistor and the third clock transistor to be turned off, and the second control line controls the second initial transistor, the second clock transistor and the fourth clock transistor to be turned on; in 3D display mode, the first control line controls the first initial transistor, the first clock transistor and the third clock transistor to be turned on, and the second control line controls the second initial transistor, the second clock transistor and the fourth clock transistor to be turned off, so that mutual conversion between the 2D display mode and the 3D display mode is convenient in the display device.

The preferable embodiments of the present invention described as above are not intended to limit the present disclosure. Various changes and modifications or equivalent embodiments of the present disclosure can be made by those skilled in the art. Any modifications, equivalent substitutes, improvement without departing from spirits and principles of the present disclosure shall fall into the scope of protection of the present disclosure.

What is claimed is:

1. A TFT array substrate, comprising:
a plurality of gate lines;
a first gate driving circuit;
a second gate driving circuit;
a first clock signal line;
a second clock signal line;
a third clock signal line;
a fourth clock signal line;
a first initial signal line;
a second initial signal line,
a first initial transistor;
a second initial transistor;
a first clock transistor;
a second clock transistor;
a third clock transistor; and
a fourth clock transistor,
wherein:
the first gate driving circuit comprises m stages of first repeating units, wherein each stage of first repeating unit comprises:
a first shift register, wherein the first shift register comprises a first input terminal, a first clock signal terminal, a third clock signal terminal, and a first output terminal connected to the corresponding gate line;
the second gate driving circuit comprises n stages of second repeating units, wherein each stage of second repeating unit comprises:
a second shift register, wherein the second shift register comprises a second input terminal, a second clock signal terminal, a fourth clock signal terminal, and a second output terminal connected to the corresponding gate line;
a drain electrode of the first initial transistor is electrically connected to a first initial signal line, a source electrode of the first initial transistor is electrically connected to the first input terminal of the first shift register from the first stage of first repeating unit, and a gate electrode of the first initial transistor is electrically connected to a first control line;
a drain electrode of the second initial transistor is electrically connected to the source electrode of the first initial transistor, the second input terminal of the second shift register from the first stage of second repeating unit is electrically connected to the second initial signal line via a source electrode of the second initial transistor, and a gate electrode of the second initial transistor is electrically connected to a second control line;
in the each stage of first repeating unit:
a drain electrode of the first clock transistor is electrically connected to the first clock signal line, a gate electrode of the first clock transistor is electrically connected to the first control line, and a source electrode of the first clock transistor is electrically connected to the first clock signal terminal;
a drain electrode of the third clock transistor is electrically connected to the third clock signal line, a gate electrode of the third clock transistor is electrically connected to the first control line, and a source electrode of the third clock transistor is electrically connected to the third clock signal terminal;
in the each stage of second repeating unit:
a drain electrode of the second clock transistor is electrically connected to the source electrode of the first clock transistor, a gate electrode of the second clock transistor is electrically connected to the second control line, and the second clock signal terminal is electrically connected to the second clock signal line via a source electrode of the second clock transistor;
a drain electrode of the fourth clock transistor is electrically connected to the source electrode of the third clock transistor, a gate electrode of the fourth clock transistor is electrically connected to the second control line, and the fourth clock signal terminal is electrically connected to the fourth clock signal line via a source electrode of the fourth clock transistor; and
m and n are positive integers, and $2 \leq m$, $2 \leq n$.

2. The TFT array substrate of claim 1, wherein:
in a 2D display mode:
the first control line controls the first initial transistor, the first clock transistor and the third clock transistor to be turned off, and
the second control line controls the second initial transistor, the second clock transistor, and the fourth clock transistor to be turned on; and
in a 3D display mode:
the first control line controls the first initial transistor, the first clock transistor and the third clock transistor to be turned on, and
the second control line controls the second initial transistor, the second clock transistor and the fourth clock transistor to be turned off.

3. The TFT array substrate of claim 2, wherein:
each stage of first repeating unit further comprises a third shift register, wherein the third shift register comprises:
a third input terminal,
a fifth clock signal terminal,
a seven clock signal terminal, and
a third output terminal connected to the corresponding gate line;
each stage of second repeating unit further comprises a fourth shift register, wherein the fourth shift register comprises:
a fourth input terminal,
a sixth clock signal terminal,
an eighth clock signal terminal, and
a fourth output terminal connected to the corresponding gate line;

the TFT array substrate further comprises:
  a third initial transistor,
  a fourth initial transistor,
  a fifth clock transistor,
  a sixth clock transistor,
  a seventh clock transistor,
  an eighth clock transistor,
  a fifth clock signal line,
  a sixth clock signal line,
  a seventh clock signal line,
  an eighth clock signal line,
  a third initial signal line, and
  a fourth initial signal line;
a drain electrode of the third initial transistor is electrically connected to the third initial signal line, a source electrode of the third initial transistor is electrically connected to the third input terminal of the third shift register from the first stage of first repeating unit, and a gate electrode of the third initial transistor is electrically connected to the first control line;
a drain electrode of the fourth initial transistor is electrically connected to the source electrode of the third initial transistor, the fourth input terminal of the fourth shift register from the first stage of second repeating unit is electrically connected to the fourth initial signal line via a source electrode of the fourth initial transistor, and a gate electrode of the fourth initial transistor is electrically connected to the second control line;
in the each stage of first repeating unit:
  a drain electrode of the fifth clock transistor is electrically connected to the fifth clock signal line, a gate electrode of the fifth clock transistor is electrically connected to the first control line, and a source electrode of the fifth clock transistor is electrically connected to the fifth clock signal terminal;
  a drain electrode of the seventh clock transistor is electrically connected to the seventh clock signal line, a gate electrode of the seventh clock transistor is electrically connected to the first control line, and a source electrode of the seventh clock transistor is electrically connected to the seventh clock signal terminal;
in the each stage of second repeating unit:
  a drain electrode of the sixth clock transistor is electrically connected to the source electrode of the fifth clock transistor, a gate electrode of the sixth clock transistor is electrically connected to the second control line, and the sixth clock signal terminal is electrically connected to the sixth clock signal line via a source electrode of the sixth clock transistor;
  a drain electrode of the eighth clock transistor is electrically connected to the source electrode of the seventh clock transistor, a gate electrode of the eighth clock transistor is electrically connected to the second control line, and the eighth clock signal terminal is electrically connected to the eighth clock signal line via a source electrode of the eighth clock transistor;
in the 2D display mode:
  the first control line further controls the third initial transistor, the fifth clock transistor and the seventh clock transistor to be turned off, and
  the second control line controls the fourth initial transistor, the sixth clock transistor and the eighth clock transistor to be turned on; and in the 3D display mode:
  the first control line controls the third initial transistor, the fifth clock transistor and the seventh clock transistor to be turned on, and
  the second control line controls the fourth initial transistor, the sixth clock transistor and the eighth clock transistor to be turned off.

4. The TFT array substrate of claim 3, wherein:
each stage of first repeating unit further comprises a fifth shift register, wherein the fifth shift register comprises a fifth input terminal, a ninth clock signal terminal, an eleventh clock signal terminal, and a fifth output terminal connected to the corresponding gate line;
each stage of first repeating unit further comprises a seventh shift register, wherein the seventh shift register comprises a seventh input terminal, a thirteenth clock signal terminal, a fifteenth clock signal terminal, and a seventh output terminal connected to the corresponding gate line;
each stage of second repeating unit further comprises a sixth shift register, wherein the sixth shift register comprises a sixth input terminal, a tenth clock signal terminal, a twelfth clock signal terminal, and a sixth output terminal connected to the corresponding gate line;
each stage of second repeating unit further comprises an eighth shift register, wherein the eighth shift register comprises an eighth input terminal, a fourteenth clock signal terminal, a sixteenth clock signal terminal, and an eighth output terminal connected to the corresponding gate line; and
the TFT array substrate further comprises:
  a fifth initial transistor,
  a sixth initial transistor,
  a seventh initial transistor,
  an eighth initial transistor,
  a ninth clock transistor,
  a tenth clock transistor,
  an eleventh clock transistor,
  a twelfth clock transistor,
  a thirteen clock transistor,
  a fourteenth clock transistor,
  a fifteenth clock transistor,
  a sixteenth clock transistor,
  a ninth clock signal line,
  a tenth clock signal line,
  an eleventh clock signal line,
  a twelfth clock signal line,
  a thirteenth clock signal line,
  a fourteenth clock signal line,
  a fifteenth clock signal line,
  a sixteenth clock signal line,
  a fifth initial signal line, a sixth initial signal line,
  a seventh initial signal line, and
  an eight initial signal line;
a drain electrode of the fifth initial transistor is electrically connected to the fifth initial signal line, a source electrode of the fifth initial transistor is electrically connected to the fifth input terminal of the fifth shift register from the first stage of first repeating unit, and a gate electrode of the fifth initial transistor is electrically connected to the first control line;
a drain electrode of the seventh initial transistor is electrically connected to the seventh initial signal line, a source electrode of the seventh initial transistor is electrically connected to the seventh input terminal of the seventh shift register from the first stage of first repeating unit, and a gate electrode of the seventh initial transistor is electrically connected to the first control line;
a drain electrode of the sixth initial transistor is electrically connected to the source electrode of the fifth initial transistor, the sixth input terminal of the sixth shift register from the first stage of second repeating unit is electrically connected to the sixth initial signal line via a source electrode of the sixth initial transistor, and a gate electrode of the sixth initial transistor is electrically connected to the second control line;
a drain electrode of the eighth initial transistor is electrically connected to the source electrode of the seventh initial transistor, the eighth input terminal of the eighth shift register from the first stage of second repeating unit is electrically connected to the eighth initial signal line via a source electrode of the eighth initial transistor, and a gate electrode of the eighth initial transistor is electrically connected to the second control line;
in each stage of first repeating unit:
  a drain electrode of the ninth clock transistor is electrically connected to the ninth clock signal line, a gate electrode of the ninth clock transistor is electrically connected to the first control line, and a source electrode of the ninth clock transistor is electrically connected to the ninth clock signal terminal;
  a drain electrode of the eleventh clock transistor is electrically connected to the eleventh clock signal line, a gate electrode of the eleventh clock transistor is electrically connected to the first control line, and a source electrode of the eleventh clock transistor is electrically connected to the eleventh clock signal terminal;
  a drain electrode of the thirteenth clock transistor is electrically connected to the thirteenth clock signal line, a gate electrode of the thirteenth clock transistor is electrically connected to the first control line, and a source electrode of the thirteenth clock transistor is electrically connected to the thirteenth clock signal terminal;
  a drain electrode of the fifteenth clock transistor is electrically connected to the fifteenth clock signal line, a gate electrode of the fifteenth clock transistor is electrically connected to the first control line, and a source electrode of the fifteenth clock transistor is electrically connected to the fifteenth clock signal terminal; and
in each stage of second repeating unit:
  a drain electrode of the tenth clock transistor is electrically connected to the source electrode of the ninth clock transistor, a gate electrode of the tenth clock transistor is electrically connected to the second control line, and the tenth clock signal terminal is electrically connected to the tenth clock signal line via a source electrode of the tenth clock transistor;
  a drain electrode of the twelfth clock transistor is electrically connected to the source electrode of the eleventh clock transistor, a gate electrode of the twelfth clock transistor is electrically connected to the second control line, and the twelfth clock signal terminal is electrically connected to the twelfth clock signal line via a source electrode of the twelfth clock transistor;
  a drain electrode of the fourteenth clock transistor is electrically connected to the source electrode of the thirteenth clock transistor, a gate electrode of the fourteenth clock transistor is electrically connected to the second control line, the fourteenth clock signal terminal is electrically connected to the fourteenth clock signal line via a source electrode of the fourteenth clock transistor;
  a drain electrode of the sixteenth clock transistor is electrically connected to the source electrode of the fifteenth clock transistor, a gate electrode of the sixteenth clock transistor is electrically connected to the second control line, the sixteenth clock signal terminal is electrically connected to the sixteenth clock signal line via a source electrode of the sixteenth clock transistor;
in the 2D display mode:
  the first control line further controls the fifth initial transistor, the ninth clock transistor, the eleventh clock transistor, the seventh initial transistor, the thirteen clock transistor and the fifteenth clock transistor to be turned off; and
  the second control line controls the sixth initial transistor, the tenth clock transistor, the twelfth clock transistor, the eighth initial transistor, the fourteenth clock transistor and the sixteenth clock transistor to be turned on; and
in the 3D display mode:
  the first control line controls the fifth initial transistor, the ninth clock transistor, the eleventh clock transistor, the seventh initial transistor, the thirteen clock transistor and the fifteenth clock transistor to be turned on; and
  the second control line controls the sixth initial transistor, the tenth clock transistor, the twelfth clock transistor, the eighth initial transistor, the fourteenth clock transistor and the sixteenth clock transistor to be turned off.

5. The TFT array substrate of claim 2, wherein:
the TFT array substrate further comprises:
  a first signal line,
  a second signal line,
  a first transistor,
  a second transistor,
the first shift register further comprises a first terminal;
the second register further comprises a second terminal;
in each stage of first repeating unit:
  a drain electrode of the first transistor is electrically connected to the first signal line, a gate electrode of the first transistor is electrically connected to the first control line, and a source electrode of the first transistor is electrically connected to the first terminal;
in each stage of second repeating unit:
  a drain electrode of the second transistor is electrically connected to the source electrode of the first transistor,
  a gate electrode of the second transistor is electrically connected to the second control line, and
  the second terminal is electrically connected to the second signal line via a source electrode of the second transistor;
in the 2D display mode, the first control line controls the first transistor to be turned off, and the second control line controls the second transistor to be turned on; and
in the 3D display mode, the first control line controls the first transistor to be turned on, and the second control line controls the second transistor to be turned off.

6. The TFT array substrate of claim 3, wherein:

the TFT array substrate further comprises: a first signal line, a second signal line, a first transistor and a second transistor, each of the first shift register and the third shift register further comprises a first terminal, and each of the second shift transistor and the fourth shift transistor further comprises a second terminal, wherein:

in each stage of first repeating unit:
- a drain electrode of the first transistor is electrically connected to the first signal line,
- a gate electrode of the first transistor is electrically connected to the first control line, and
- a source electrode of the first transistor is electrically connected to the first terminals of the first shift register and the third shift register;

in each stage of second repeating unit:
- a drain electrode of the second transistor is electrically connected to the source electrode of the first transistor,
- a gate electrode of the second transistor is electrically connected to the second control line, and
- the second terminals of the second shift transistor and the fourth shift transistor are electrically connected to the second signal line via a source electrode of the second transistor;

in the 2D display mode, the first control line controls the first transistor to be turned off, and the second control line controls the second transistor to be turned on; and in the 3D display mode, the first control line controls the first transistor to be turned on, and the second control line controls the second transistor to be turned off.

7. The TFT array substrate of claim 4, wherein:

the TFT array substrate further comprises: a first signal line, a second signal line, a first transistor and a second transistor, each of the first shift register, the third shift register, the fifth shift register and the seventh shift register further comprises a first terminal, and each of the second shift register, the fourth shift register, the sixth shift register and the eighth shift register further comprises a second terminal;

in each stage of first repeating unit:
- a drain electrode of the first transistor is electrically connected to the first signal line,
- a gate electrode of the first transistor is electrically connected to the first control line, and
- a source electrode of the first transistor is electrically connected to the first terminals of the first shift register, the third shift register, the fifth shift register and the seventh shift register;

in each stage of second repeating unit:
- a drain electrode of the second transistor is electrically connected to the source electrode of the first transistor,
- a gate electrode of the second transistor is electrically connected to the second control line, and
- the second terminals of the second shift register, the fourth shift register, the sixth shift register and the eighth shift register are electrically connected to the second signal line via a source electrode of the second transistor;

in the 2D display mode, the first control line controls the first transistor to be turned off, and the second control line controls the second transistor to be turned on;

in the 3D display mode, the first control line controls the first transistor to be turned on, and the second control line controls the second transistor to be turned off.

8. The TFT array substrate of any of claim 5, wherein at least one of:
- the first signal line is configured to output a first pre-scan reset signal for resetting the first repeating unit before scanning, and the second signal line is configured to output a second pre-scan reset signal for resetting the second repeating unit before scanning;
- the first signal line is configured to output a constant high level signal, and the second signal line is configured to output a constant low level signal;
- the first signal line is configured to output a constant low level signal, and the second signal line is configured to output a constant high level signal;
- the first signal line is configured to output a forward scanning signal, and the second signal line also is configured to output a forward scanning signal; and
- the first signal line is configured to output a backward scanning signal, and the second signal line also is configured to output a backward scanning signal.

9. The TFT array substrate of claim 1, wherein the first clock signal line, the second clock signal line, the third clock signal line, and the fourth clock signal line are configured to output a first clock signal, a second clock signal, a third clock signal and a fourth clock signal, respectively, wherein the first clock signal is inverse to the third clock signal, and the second clock signal is inverse to the fourth clock signal.

10. The TFT array substrate of claim 3, wherein the first clock signal line, the second clock signal line, the third clock signal line, and the fourth clock signal line are configured to output a first clock signal, a second clock signal, a third clock signal and a fourth clock signal, respectively, wherein the fifth clock signal line, the sixth clock signal line, the seventh clock signal line and the eighth clock signal line are configured to output a fifth clock signal, a sixth clock signal, a seventh clock signal and an eighth clock signal, respectively, and wherein the first clock signal is inverse to the third clock signal, the second clock signal is inverse to the fourth clock signal, the fifth clock signal is inverse to the seventh clock signal, and the sixth clock signal is inverse to the eighth clock signal.

11. The TFT array substrate of claim 4, wherein the first clock signal line, the second clock signal line, the third clock signal line and the fourth clock signal line are configured to output a first clock signal, a second clock signal, a third clock signal and a fourth clock signal, respectively, wherein the fifth clock signal line, the sixth clock signal line, the seventh clock signal line and the eighth clock signal line are configured to output a fifth clock signal, a sixth clock signal, a seventh clock signal and an eighth clock signal, respectively, wherein the ninth clock signal line, the tenth clock signal line, the eleventh clock signal line and the twelfth clock signal line are configured to output a ninth clock signal, a tenth clock signal, an eleventh clock signal and a twelfth clock signal, respectively, wherein the thirteenth clock signal line, the fourteenth clock signal line, the fifteenth clock signal line and the sixteenth clock signal line are configured to output a thirteenth clock signal, a fourteenth clock signal, a fifteenth clock signal and a sixteenth clock signal, respectively, and wherein the first clock signal is inverse to the third clock signal, the second clock signal is inverse to the fourth clock signal, the fifth clock signal is inverse to the seventh clock signal, the sixth clock signal is inverse to the eighth clock signal, the ninth clock signal is inverse to the eleventh clock signal, the tenth clock signal is inverse to the twelfth clock signal, the thirteenth clock signal is inverse to the fifteenth clock signal, and the fourteenth clock signal is inverse to the sixteenth clock signal.

12. The TFT array substrate of claim 1, wherein:
the first shift register further comprises a first clear terminal;
the second shift register further comprises a second clear terminal;
in the first to (m−1)-th stages of first repeating units, the first clear terminal of the first shift register from the k-th stage of first repeating unit is electrically connected to the first output terminal of the first shift register from the (k+1)-th stage of first repeating unit;
in the first to (n−1)-th stages of second repeating units, the second clear terminal of the second shift register from the p-th stage of second repeating unit is electrically connected to the second output terminal of the second shift register from the (p+1)-th stage of the second repeating unit; and
k and p are positive integers, and $1 \leq k \leq (m-1)$, $1 \leq p \leq (n-1)$.

13. The TFT array substrate of claim 3, wherein:
the first shift register further comprises a first clear terminal, the second shift register further comprises a second clear terminal, the third shift register further comprises a third clear terminal, and the fourth shift register further comprises a fourth clear terminal;
in the first to (m−1)-th stages of first repeating units, the first clear terminal of the first shift register from the k-th stage of first repeating unit is electrically connected to the first output terminal of the first shift register from the (k+1)-th stage of first repeating unit, and the third clear terminal of the third shift register from the k-th stage of first repeating unit is electrically connected to the third output terminal of the third shift register from the (k+1)-th stage of first repeating unit; and
in the first to (n−1)-th stages of second repeating units, the second clear terminal of the second shift register from the p-th stage of second repeating unit is electrically connected to the second output terminal of the second shift register from the (p+1)-th stage of second repeating unit, and the fourth clear terminal of the fourth shift register from the p-th stage of second repeating unit is electrically connected to the fourth output terminal of the fourth shift register from the (p+1)-th stage of second repeating unit; wherein k and p are positive integers, and $1 \leq k \leq (m-1)$, $1 \leq p \leq (n-1)$.

14. The TFT array substrate of claim 4, wherein:
the first shift register further comprises a first clear terminal, the second shift register further comprises a second clear terminal, the third shift register further comprises a third clear terminal, the fourth shift register further comprises a fourth clear terminal, the fifth shift register further comprises a fifth clear terminal, the sixth shift register further comprises a sixth clear terminal, the seventh shift register further comprises a seventh clear terminal, and the eighth shift register further comprises an eighth clear terminal;
in the first to (m−1)-th stages of first repeating units:
the first clear terminal of the first shift register from the k-th stage of first repeating unit is electrically connected to the first output terminal of the first shift register from the (k+1)-th stage of first repeating unit,
the third clear terminal of the third shift register from the k-th stage of first repeating unit is electrically connected to the third output terminal of the third shift register from the (k+1)-th stage of first repeating unit,
the fifth clear terminal of the fifth shift register from the k-th stage of first repeating unit is electrically connected to the fifth output terminal of the fifth shift register from the (k+1)-th stage of first repeating unit, and
the seventh clear terminal of the seventh shift register from the k-th stage of first repeating unit is electrically connected to the seventh output terminal of the seventh shift register from the (k+1)-th stage of first repeating unit;
in the first to (n−1)-th stages of second repeating units:
the second clear terminal of the second shift register from the p-th stage of second repeating unit is electrically connected to the second output terminal of the second shift register from the (p+1)-th stage of second repeating unit,
the fourth clear terminal of the fourth shift register from the p-th stage of second repeating unit is electrically connected to the fourth output terminal of the fourth shift register from the (p+1)-th stage of second repeating unit,
the sixth clear terminal of the sixth shift register from the p-th stage of second repeating unit is electrically connected to the sixth output terminal of the sixth shift register from the (p+1)-th stage of second repeating unit, and
the eighth clear terminal of the eighth shift register from the p-th stage of second repeating unit is electrically connected to the eighth output terminal of the eighth shift register from the (p+1)-th stage of second repeating unit; and
k and p are positive integers, and $1 \leq k \leq (m-1)$, $1 \leq p \leq (n-1)$.

15. The TFT array substrate of claim 4, wherein:
in the second to m-th stages of first repeating units, the first input terminal of the first shift register from the i-th stage of first repeating unit is electrically connected to the first output terminal of the first shift register from the (i−1)-th stage of first repeating unit; and
in the second to n-th stages of second repeating units, the second input terminal of the second shift register from the j-th stage of the second repeating unit is electrically connected to the second output terminal of the second shift register from the (j−1)-th stage of second repeating unit, wherein i and j are positive integers, and $2 \leq i \leq m$, $2 \leq j \leq n$.

16. The TFT array substrate of claim 3, wherein:
in the second to m-th stages of first repeating units:
the first input terminal of the first shift register from the i-th stage of the first repeating unit is electrically connected to the first output terminal of the first shift register from the (i−1)-th stage of first repeating unit,
the third input terminal of the third shift register from the i-th stage of the first repeating unit is electrically connected to the third output terminal of the third shift register from the (i−1)-th stage of first repeating unit; and
in the second to n-th stages of second repeating units:
the second input terminal of the second shift register from the j-th stage of second repeating unit is electrically connected to the second output terminal of the second shift register from the (j−1)-th stage of second repeating unit, and
the fourth input terminal of the fourth shift register from the j-th stage of second repeating unit is electrically connected to the fourth output terminal of the fourth shift register from the (j−1)-th stage of second repeating unit.

17. The TFT array substrate of claim 4, wherein:
in the second to m-th stages of first repeating units:
- the first input terminal of the first shift register from the i-th stage of first repeating unit is electrically connected to the first output terminal of the first shift register from the (i−1)-th stage of first repeating unit,
- the third input terminal of the third shift register from the i-th stage of first repeating unit is electrically connected to the third output terminal of the third shift register from the (i−1)-th stage of first repeating unit,
- the fifth input terminal of the fifth shift register from the i-th stage of first repeating unit is electrically connected to the fifth output terminal of the fifth shift register from the (i−1)-th stage of first repeating unit, and
- the seventh input terminal of the seventh shift register from the i-th stage of first repeating unit is electrically connected to the seventh output terminal of the seventh shift register from the (i−1)-th stage of first repeating unit; and in the second to n-th stages of second repeating units:
- the second input terminal of the second shift register from the j-th stage of second repeating unit is electrically connected to the second output terminal of the second shift register from the (j−1)-th stage of second repeating unit,
- the fourth input terminal of the fourth shift register from the j-th stage of second repeating unit is electrically connected to the fourth output terminal of the fourth shift register from the (j−1)-th stage of second repeating unit,
- the sixth input terminal of the sixth shift register from the j-th stage of second repeating unit is electrically connected to the sixth output terminal of the sixth shift register from the (j−1)-th stage of second repeating unit, and
- the eighth input terminal of the eighth shift register from the j-th stage of second repeating unit is electrically connected to the eighth output terminal of the eighth shift register from the (j−1)-th stage of second repeating unit.

18. A display panel, comprising the TFT array substrate of claim 1.

19. A display device, comprising the TFT array substrate of claim 1.

* * * * *